United States Patent
Kim et al.

(10) Patent No.: US 12,364,112 B2
(45) Date of Patent: Jul. 15, 2025

(54) DISPLAY DEVICE COMPRISING A CONNECTION ELECTRODE DISPOSED ON AN ORGANIC INSULATING LAYER AND A PORTION OF WHICH IS DISPOSED IN A CONTACT HOLE

(71) Applicant: Samsung Display Co., Ltd., Yongin-Si (KR)

(72) Inventors: Youn Joon Kim, Seoul (KR); Jinho Ju, Seoul (KR); Jonghyun Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 636 days.

(21) Appl. No.: 17/721,696

(22) Filed: Apr. 15, 2022

(65) Prior Publication Data

US 2023/0055898 A1 Feb. 23, 2023

(30) Foreign Application Priority Data

Aug. 23, 2021 (KR) .................. 10-2021-0110759

(51) Int. Cl.
| | |
|---|---|
| *H10K 59/123* | (2023.01) |
| *H10K 59/124* | (2023.01) |
| *H10K 71/00* | (2023.01) |
| *H10K 77/10* | (2023.01) |
| *H10K 59/12* | (2023.01) |
| *H10K 102/00* | (2023.01) |

(52) U.S. Cl.
CPC .......... *H10K 59/123* (2023.02); *H10K 71/00* (2023.02); *H10K 59/1201* (2023.02); *H10K 59/124* (2023.02); *H10K 77/111* (2023.02); *H10K 2102/311* (2023.02)

(58) Field of Classification Search
CPC .... H10K 59/123; H10K 71/00; H10K 59/124; H10K 2102/311; H10K 59/131; H10K 59/1201; H10K 71/111
See application file for complete search history.

(56) References Cited

U.S. PATENT DOCUMENTS 10,236,332 B2 * 3/2019 Jung .................. H10K 59/1216
2008/0252201 A1 * 10/2008 Pearce ................ H10K 71/231
445/24

(Continued)

FOREIGN PATENT DOCUMENTS

| CN | 110416233 A | 11/2019 |
|---|---|---|
| JP | 6350754 B1 | 7/2018 |
| KR | 10-2019-0107227 A | 9/2019 |

*Primary Examiner* — Khiem D Nguyen
(74) *Attorney, Agent, or Firm* — Innovation Counsel LLP

(57) ABSTRACT

Provided is a display device. The display device comprises a base layer, a circuit layer on the base layer, and a light emitting element on the circuit layer, wherein the circuit layer includes at least one organic insulating layer in which a contact hole is defined, and a connection electrode disposed on the at least one organic insulating layer, a portion of which is disposed in the contact hole, wherein a minimum value of a width in one direction of the contact hole is about 1.8 micrometers or more and less than about 2.5 micrometers, and wherein an upper width of the connection electrode in the one direction is about 3.6 micrometers or more and less than about 6 micrometers.

9 Claims, 18 Drawing Sheets

(56) References Cited

U.S. PATENT DOCUMENTS

| | | | |
|---|---|---|---|
| 2011/0116019 A1* | 5/2011 | Hwang | G02F 1/13452 |
| | | | 349/84 |
| 2014/0183535 A1* | 7/2014 | Choi | H10K 59/123 |
| | | | 438/158 |
| 2019/0181360 A1* | 6/2019 | Cha | H10K 71/621 |
| 2019/0278145 A1 | 9/2019 | Tanaka et al. | |
| 2019/0280068 A1* | 9/2019 | Shin | H10K 59/1201 |
| 2020/0098842 A1* | 3/2020 | Jeon | H10K 59/123 |
| 2021/0066352 A1 | 3/2021 | Cheng et al. | |

\* cited by examiner

DISPLAY DEVICE COMPRISING A CONNECTION ELECTRODE DISPOSED ON AN ORGANIC INSULATING LAYER AND A PORTION OF WHICH IS DISPOSED IN A CONTACT HOLE

CROSS-REFERENCE TO RELATED APPLICATIONS

This U.S. non-provisional patent application claims priority under 35 U.S.C. § 119 of Korean Patent Application No. 10-2021-0110759, filed on Aug. 23, 2021, the entire contents of which are hereby incorporated by reference.

BACKGROUND

1. Field of Disclosure

The present disclosure herein relates to a display device and a method of manufacturing the same, and more particularly, to a display device having high resolution, high speed driving, and high robustness characteristics and a method of manufacturing the same.

2. Description of the Related Art

A display device includes a plurality of pixels and a driving circuit (e.g., a scan driving circuit and a data driving circuit) for controlling the plurality of pixels. Each of the plurality of pixels includes a display element and a pixel driving circuit for controlling the display element. The driving circuit of the pixel may include a plurality of organically connected transistors.

As the size and resolution of display devices gradually increase, the number of signal wires and connection electrodes connecting the display element and the transistor included in the pixels increases, and the degree of integration of the driving circuit included in the pixels increases. In addition, in order to improve the robustness of flexible display devices that can be variously deformed in shape, the driving circuit of the pixel includes more organic layers and connection electrodes, so that more signal wires and connection electrodes are disposed within the pixel pitch.

SUMMARY

The present disclosure provides a display device capable of realizing high-resolution and high-speed driving with a pixel circuit having a high degree of integration, and a method of manufacturing the same.

The present disclosure provides a display device having improved robustness by including a plurality of organic insulating layers and connection electrodes in a circuit layer, and a method for manufacturing the same.

An embodiment of the present disclosure provides a display device including: a base layer; a circuit layer on the base layer; and a light emitting element on the circuit layer, wherein the circuit layer includes at least one organic insulating layer in which a contact hole is defined; and a connection electrode disposed on the at least one organic insulating layer, a portion of which is disposed in the contact hole, wherein a minimum value of a width in one direction of the contact hole is about 1.8 micrometers or more and less than about 2.5 micrometers, and wherein an upper width of the connection electrode in the one direction is about 3.6 micrometers or more and less than about 6 micrometers.

In an embodiment, the circuit layer may further include a transistor disposed between the at least one organic insulating layer and the base layer, wherein the connection electrode may be electrically connected to the transistor.

In an embodiment, the at least one organic insulating layer may include: a first organic insulating layer on the transistor; and a second organic insulating layer on the first organic insulating layer, wherein a first contact hole may be defined in the first organic insulating layer, and wherein a minimum value of a width of the first contact hole in the one direction may be about 1.8 micrometers or more and less than about 2.5 micrometers.

In an embodiment, the connection electrode may include a first connection electrode disposed in the first contact hole, wherein an upper width of the first connection electrode in the one direction may be about 3.6 micrometers or more and less than about 6 micrometers.

In an embodiment, a second contact hole may be defined in the second organic insulating layer, wherein the connection electrode may further include a second connection electrode disposed in the second contact hole and electrically connected to the first connection electrode, wherein a minimum value of a width of the second contact hole in the one direction may be about 1.8 micrometers or more and less than about 2.5 micrometers, and wherein an upper width of the second connection electrode in the one direction may be about 3.6 micrometers or more and less than about 6 micrometers.

In an embodiment, the circuit layer may further include a lower connection electrode connected to the transistor and electrically connected to the connection electrode, and wherein an upper width of the lower connection electrode in the one direction may be substantially equal to an upper width of the connection electrode in the one direction.

In an embodiment, the circuit layer may include at least one inorganic insulating layer disposed between the base layer and the organic insulating layer, wherein a lower contact hole may be defined in the at least one inorganic insulating layer, and wherein the lower connection electrode may be connected to the transistor through the lower contact hole.

In an embodiment, the contact hole may include: a first contact hole part having a first inclination measured from a vertical imaginary axis; and a second contact hole part defined on the first contact hole part and having a second inclination measured from the same vertical imaginary axis greater than the first inclination.

In an embodiment, a minimum value of a width in the one direction of the first contact hole part may be about 1.8 micrometers or more and less than about 2.5 micrometers.

In an embodiment, the light emitting element may include: a first electrode on the organic insulating layer; a light emitting layer on the first electrode; and a second electrode on the light emitting layer, wherein an upper contact hole exposing an upper surface of the connection electrode may be defined in the organic insulating layer, and wherein a portion of the first electrode may be disposed in the upper contact hole and connected to the connection electrode.

In an embodiment of the present disclosure, a display device includes: a base layer; a circuit layer on the base layer; and a light emitting element on the circuit layer; wherein the circuit layer includes: at least one organic insulating layer in which a contact hole is defined; and a connection electrode, a portion of which is disposed in the contact hole, wherein the contact hole includes: a first contact hole part having a first inclination measured from a vertical imaginary axis; and a second contact hole part defined on the first contact hole part and having a second inclination measured from the same vertical imaginary axis greater than the first inclination, and wherein a minimum value of a width in one direction of the first contact hole part is about 1.8 micrometers or more and less than about 2.5 micrometers.

In an embodiment of the present disclosure, a method of manufacturing a display device includes: forming a lower connection electrode; forming an organic insulating layer covering the lower connection electrode; and forming a contact hole in the organic insulating layer to expose a portion of the lower connection electrode, wherein the forming of the contact hole includes: forming an inorganic layer on the organic insulating layer; etching the inorganic layer to form an inorganic pattern layer in which an opening is defined; and etching the organic insulating layer using the inorganic pattern layer as a mask.

In an embodiment, the method may further include, after the forming of the contact hole, forming a connection electrode partially disposed in the contact hole.

In an embodiment, the forming of the inorganic pattern layer may include: forming a photoresist pattern on the inorganic layer; and forming the opening by etching the inorganic layer using the photoresist pattern as a mask.

In an embodiment, the forming of the contact hole may further include, after the forming of the inorganic pattern layer, removing the photoresist pattern.

In an embodiment, the removing of the photoresist pattern may be performed between the forming of the inorganic pattern layer and the forming of the contact hole.

In an embodiment, the removing of the photoresist pattern may be performed after the forming of the contact hole.

In an embodiment, an upper width in one direction of the lower connection electrode exposed by the contact hole may be about 1.8 micrometers or more and less than about 2.5 micrometers.

In an embodiment, the contact hole may include a first contact hole part having a first inclination measured from a vertical imaginary axis and a second contact hole part having a second inclination measured from the same vertical imaginary axis, wherein during the forming of the inorganic pattern layer, an upper part of the organic insulating layer may be etched to form a second contact hole part, wherein during the etching of the organic insulating layer, the remaining part of the organic insulating layer may be etched to form a first contact hole part, and wherein the first inclination may be smaller than the second inclination.

In an embodiment, during the etching of the organic insulating layer, the organic insulating layer may be dry-etched.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1A:
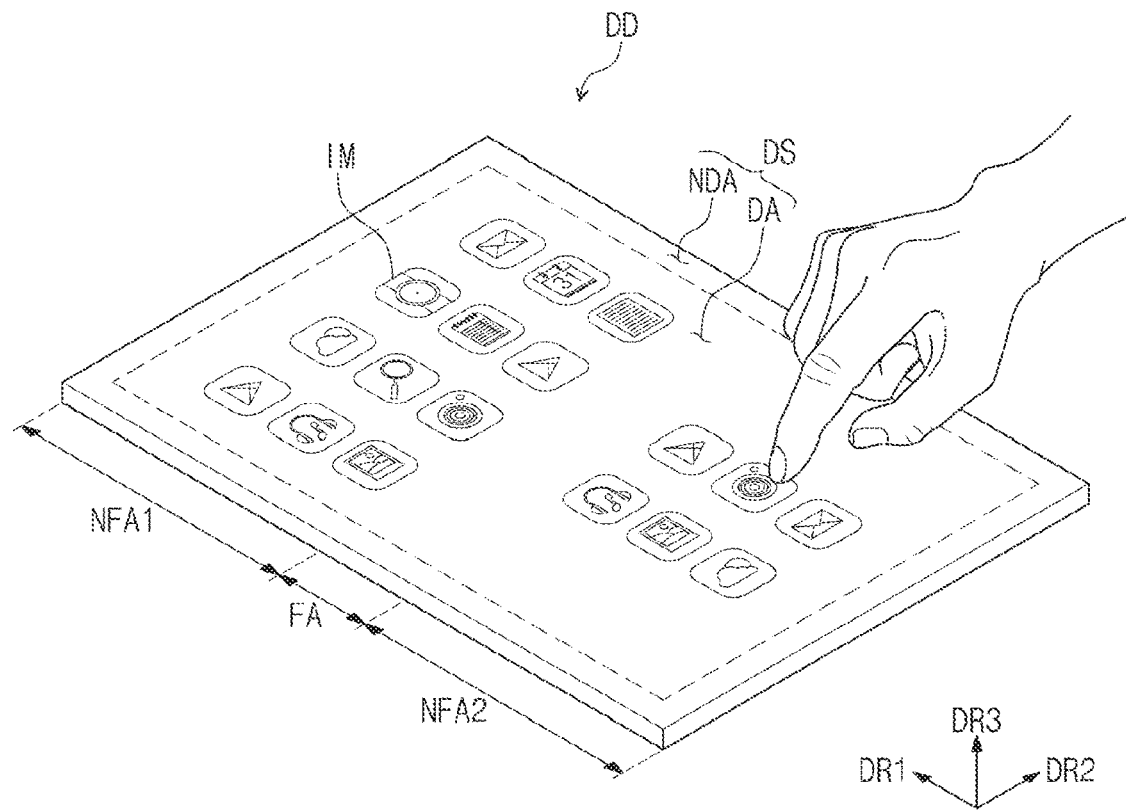
FIGS. 1A, 1B, and 1C are perspective views of a display device according to an embodiment of the present disclosure.

In this specification, when an element (or region, layer, part, etc.) is referred to as being "on", "connected to", or "coupled to" another element, it means that it can be directly placed on/connected to/coupled to other components, or a third component can be arranged between them.

Like reference numerals refer to like elements. Additionally, in the drawings, the thicknesses, proportions, and dimensions of components are exaggerated for effective description. "And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the present disclosure. The terms of a singular form may include plural forms unless otherwise specified.

In addition, terms such as "below", "the lower side", "on", and "the upper side" are used to describe a relationship of components shown in the drawing. The terms are described as a relative concept based on a direction shown in the drawing.

In various embodiments of the present disclosure, the term "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which this present disclosure belongs. In addition, terms such as terms defined in commonly used dictionaries should be interpreted as having a meaning consistent with the meaning in the context of the related technology, and it should not be construed in an overly ideal or overly formal sense unless explicitly defined here.

Hereinafter, embodiments of the present disclosure will be described with reference to the drawings.

Figure 1B:
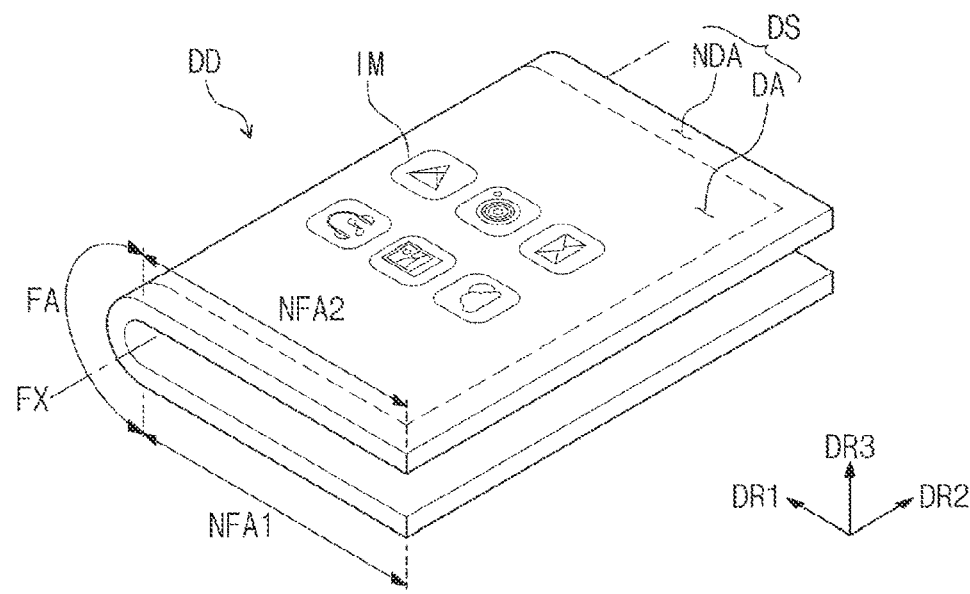
Figure 1C:
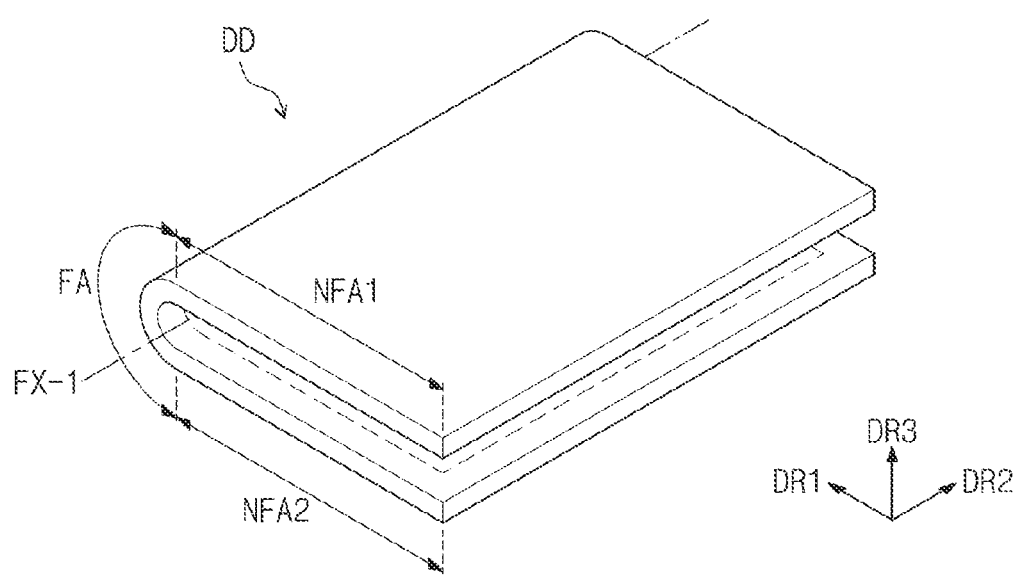

FIGS. 1A, 1B, and 1C are perspective views of a display device according to an embodiment of the present disclosure. FIG. 1A is a diagram illustrating an unfolded state of a display device according to an embodiment of the present disclosure, and FIGS. 1B and 1C are diagrams illustrating a folded state of the display device illustrated in FIG. 1A.

Referring to FIG. 1A, a display device DD according to an embodiment of the present disclosure may have a rectangular shape with long sides extending in a first direction DR1 and short sides extending in a second direction DR2 intersecting the first direction DR1. However, the embodiment of the present disclosure is not limited thereto, and the display device DD may have various shapes such as a circle and a polygon. The display device DD may be a flexible display device.

Hereinafter, the direction substantially perpendicular to the plane defined by the first direction DR1 and the second direction DR2 is defined as the third direction DR3. In addition, in this specification, the meaning of "when viewed from the plane" may mean a state viewed from the third direction DR3. That is, the third direction DR3 may be a thickness direction.

The display device DD may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The folding area FA, the first non-folding area NFA1, and the second non-folding area NFA2 may be arranged in the first direction DR1.

The upper surface of the display device DD may be defined as the display surface DS and may have a plane defined by the first direction DR1 and the second direction DR2. The images IM generated by the display device DD may be provided to a user through the display surface DS.

The display surface DS may include a display area DA and a non-display area NDA around the display area DA. The display area DA may display an image, and the non-display area NDA may not display an image. The non-display area NDA may surround the display area DA and may define an outline portion of the display device DD printed in a predetermined color.

Referring to FIGS. 1B and 1C, the display device DD may be a foldable display device DD that can be folded or unfolded. For example, the folding area FA may be bent based on the folding axes FX and FX-1 parallel to the second direction DR2, so that the display device DD may be folded. The folding axes FX and FX-1 may be defined as a short axis parallel to a short side of the display device DD. That is, the folding axes FX and FX-1 extend along the second direction DR2.

When the display device DD is folded, as shown in FIG. 1B, the display device DD is bent based on the folding axis FX defined below the display device DD so that the first non-folding area NFA1 and the second non-folding areas NFA2 face each other and the display surface DS is exposed to the outside, and accordingly, the display device DD may be out-folded. Alternatively, as shown in FIG. 1C, the display device DD is bent based on the folding axis FX-1 defined above the display device DD so that the first non-folding area NFA1 and the second non-folding areas NFA2 face each other and the display surface DS is not exposed to the outside, and accordingly, the display device DD may be in-folded.

Figure 2A:
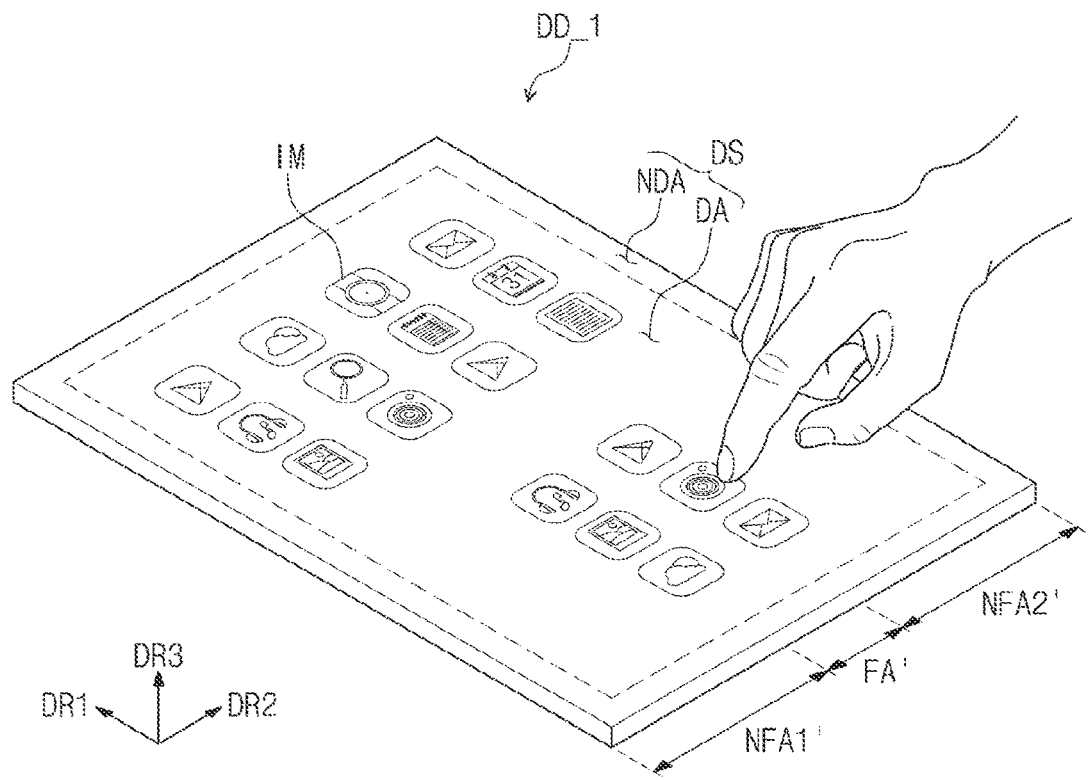
FIGS. 2A, 2B, and 2C are perspective views of a display device according to an embodiment of the present disclosure.
Figure 2B:
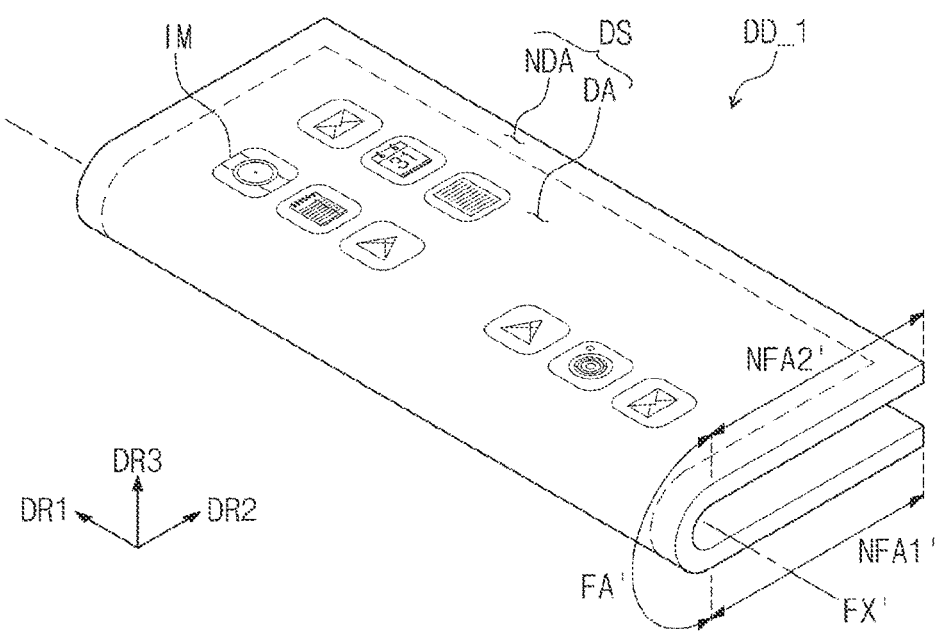
Figure 2C:
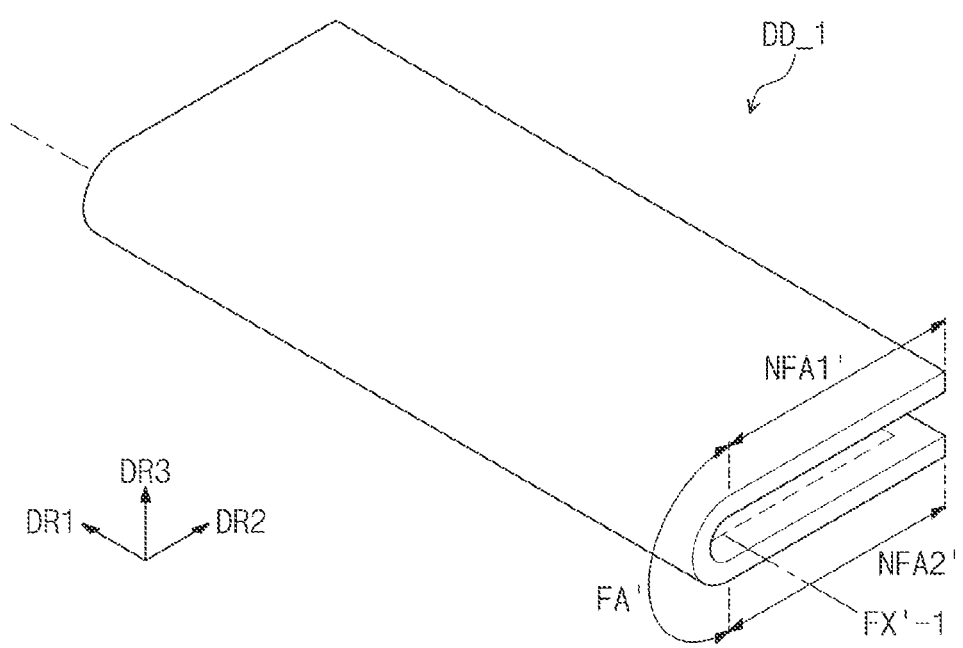

FIGS. 2A, 2B, and 2C are perspective views of a display device according to an embodiment of the present disclosure. FIG. 2A is a diagram illustrating an unfolded state of a display device according to an embodiment of the present disclosure, and FIGS. 2B and 2C are diagrams illustrating a folded state of a display device illustrated in FIG. 2A.

Referring to FIGS. 2A, 2B, and 2C, a display device DD_1 may include a folding area FA' and a plurality of non-folding areas NFA1' and NFA2'. The non-folding areas NFA1' and NFA2' may include a first non-folding area NFA1' and a second non-folding area NFA2'. The folding area FA' may be disposed between the first non-folding area NFA1' and the second non-folding area NFA2'. The folding area FA', the first non-folding area NFA1', and the second non-folding area NFA2' may be arranged in the second direction DR2.

The folding area FA' may be bent based on the folding axes FX' and FX'-1 parallel to the first direction DR1, so that the display device DD_1 may be folded. The folding axis FX' may be defined as a long axis parallel to the long side of the display device DD_1. That is, the folding axis FX' extends along the second direction DR2. The display device DD illustrated in FIG. 1A may be folded based on a short axis, and unlike this, the display device DD_1 illustrated in FIG. 2A may be folded based on a long axis. As shown in FIG. 2B, the display device DD_1 is bent based on the folding axis FX' defined below the display device DD_1 so that the first non-folding area NFA1' and the second non-folding areas NFA2' face each other and the display surface DS is exposed to the outside, and accordingly, the display device DD_1 may be out-folded. Alternatively, as shown in FIG. 2C, the display device DD_1 is bent based on the folding axis FX'-1 defined above the display device DD_1 so that the first non-folding area NFA1' and the second non-folding areas NFA2' face each other and the display surface DS is not exposed to the outside, and accordingly, the display device DD_1 may be in-folded.

Figure 3:
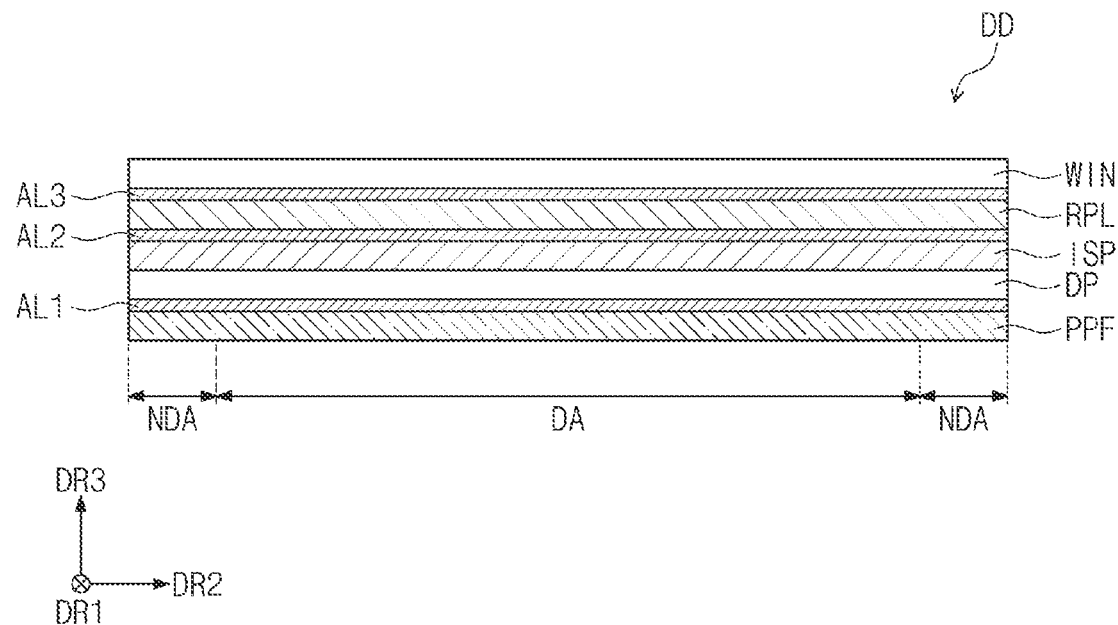
FIG. 3 is a cross-sectional view of a display device according to an embodiment of the present disclosure.

Hereinafter, the structure of the display device DD that is folded based on the short axis shown in FIGS. 1A, 1B, and 1C will be described, but is not limited thereto, and structures to be described later may also be applied to the display device DD_1 that is folded with respect to the long axis illustrated in FIGS. 2A to 2C. FIG. 3 is a cross-sectional view of a display device according to an embodiment of the present disclosure. For example, in FIG. 3, a cross-section of the display device DD viewed from the first direction DR1 is illustrated.

Referring to FIG. 3, the display device DD may include a display panel DP, an input sensing unit ISP, an antireflection layer RPL, a window WIN, a panel protection film PPF, and first, second, and third adhesive layers AL1, AL2, and AL3.

The display panel DP may be a flexible display panel. The display panel DP according to an embodiment of the present disclosure may be a light emitting display panel, and is not particularly limited. For example, the display panel DP may be an organic light emitting display panel or an inorganic light emitting display panel. In the organic light emitting display panel, the light emitting layer may include an organic light emitting material. The light emitting layer of the inorganic light emitting display panel may include quantum dot, quantum rod, and the like. Hereinafter, the display panel DP is described as the organic light emitting display panel.

The input sensing unit ISP may be disposed on the display panel DP. The input sensing unit ISP may include a plurality of sensing units (not shown) for sensing an external input in a capacitive manner. The input sensing unit ISP may be directly manufactured on the display panel DP when the display device DD is manufactured. That is, the input sensing unit ISP may be directly disposed on the display panel DP. Meanwhile, in the present specification, "directly disposed" may mean that there is no layer, film, region, plate, and the like added between a portion such as a layer, film, region, or plate and another portion. The input sensing unit ISP may be disposed to contact the upper surface of the display panel DP without using an additional member such as a separate adhesive member. However, the embodiment of the present disclosure is not limited thereto, and the input sensing unit ISP may be manufactured as a separate panel from the display panel DP, and may be attached to the display panel DP by an adhesive layer.

The antireflection layer RPL may be disposed on the input sensing unit ISP. The antireflection layer RPL may be defined as an external light antireflection film. The antireflection layer RPL may reduce reflectance of external light incident on the display panel DP from above the display device DD.

When external light propagating toward the display panel DP is reflected from the display panel DP and provided to an external user again, like a mirror, the user can see external light. In order to prevent this phenomenon, for example, the antireflection layer RPL may include a plurality of color filters displaying the same color as the pixels of the display panel DP.

The color filters may filter external light to the same color as the pixels. In this case, external light may not be recognized by the user. However, the embodiment of the present disclosure is not limited thereto, and the antireflection layer RPL may include a phase retarder and/or a polarizer to reduce the reflectance of external light.

The window WIN may be disposed on the antireflection layer RPL. The window WIN may protect the display panel DP, the input sensing unit ISP, and the antireflection layer RPL from external scratches and impacts.

The panel protection film PPF may be disposed under the display panel DP. The panel protection film PPF may protect the lower part of the display panel DP. The panel protection film PPF may include a flexible plastic material such as polyethylene terephthalate (PET).

The first adhesive layer AL1 may be disposed between the display panel DP and the panel protection film PPF. That is, the display panel DP and the panel protection film PPF may be bonded together by the first adhesive layer ALE The second adhesive layer AL2 is disposed between the antireflection layer RPL and the input sensing unit ISP. That is, the antireflection layer RPL and the input sensing unit ISP may be bonded together by the second adhesive layer AL2. The third adhesive layer AL3 may be disposed between the window WIN and the antireflection layer RPL. That is, the window WIN and the antireflection layer RPL may be bonded together by the third adhesive layer AL3. FIG. 3 illustrates that the panel protection film PPF is attached under the display panel DP by the first adhesive layer ALL but the embodiment of the present disclosure is not limited thereto, and the first adhesive layer AL1 may be omitted, and the panel protection film PPF may be directly disposed under the display panel DP. FIG. 3 illustrates that the antireflection layer RPL is attached on the input sensing unit ISP by the second adhesive layer AL2, but the embodiment of the present disclosure is not limited thereto, and the second adhesive layer AL2 may be omitted, and the antireflection layer RPL may be directly disposed on the input sensing unit ISP. FIG. 3 illustrates that the window WIN is attached to the antireflection layer RPL by the third adhesive layer AL3, but the embodiment of the present disclosure is not limited thereto, and the third adhesive layer AL3 may be omitted, and the window WIN may be directly disposed on the antireflection layer RPL. Each of the first adhesive layers AL1 to AL3 may include an acrylic adhesive, a urethane adhesive, a silicone adhesive, an epoxy adhesive, a rubber adhesive, or a vinyl ether adhesive. Each of the adhesive layers ALL AL2, and AL3 may be a transparent adhesive member such as a pressure sensitive adhesive film (PSA), an optically clear adhesive film (OCA), or an optically clear adhesive resin (OCR).

Figure 4:
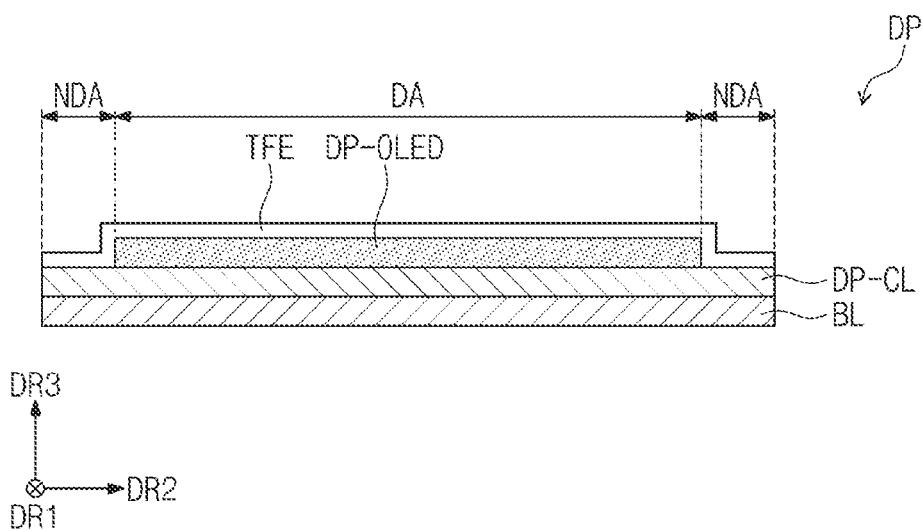
FIG. 4 is a cross-sectional view of a display panel according to an embodiment.

FIG. 4 is a cross-sectional view of a display panel according to an embodiment of the present disclosure. For example, in FIG. 5, a cross-section of the display panel DP viewed from the first direction DR1 is illustrated.

Referring to FIG. 4, the display panel DP may include a base layer BL, a circuit layer DP-CL disposed on the base layer BL, a display element layer DP-OLED disposed on the circuit layer DP-CL, and a thin film encapsulation layer TFE disposed on the display element layer DP-OLED and the circuit layer DP-CL.

The base layer BL may include a display area DA and a non-display area NDA which is disposed around the display area DA. The base layer BL may be a flexible substrate, and may include any flexible material that can be bent or folded without limitation. For example, the base layer BL may include a flexible plastic material such as polyimide (PI). Alternatively, the base layer BL may include a flexible substrate such as a thin film glass substrate or a thin film metal substrate.

The display element layer DP-OLED may be disposed on the display area DA.

A plurality of pixels may be disposed in the circuit layer DP-CL and the display element layer DP-OLED. Each of the pixels may include transistors disposed on the circuit layer DP-CL and a light emitting device disposed on the display element layer DP-OLED and connected to the transistors. The transistor may include a semiconductor pattern including a source, an active, and a drain, and a gate. The light emitting element may include a first electrode, a light emitting layer, and a second electrode sequentially stacked, and the first electrode of the light emitting element may be connected to a drain of the transistor through connection electrodes. A detailed configuration of the pixel will be described in detail below with reference to FIG. 6.

The thin film encapsulation layer TFE may be disposed on the circuit layer DP-CL to cover the display element layer DP-OLED. The thin film encapsulation layer TFE may protect pixels from moisture, oxygen, and foreign substances. The thin film encapsulation layer TFE may have a single-layer structure or a multi-layer structure. The thin film encapsulation layer TFE may include a plurality of sequentially stacked inorganic layers and at least one organic layer, but the layers constituting the thin film encapsulation layer TFE, are not limited thereto. The thin film encapsulation layer TFE may include, for example, one organic layer structure disposed between two inorganic layers. Alternatively, the thin film encapsulation layer TFE may include a structure in which a plurality of inorganic layers and a plurality of organic layers are alternately disposed.

Figure 5:
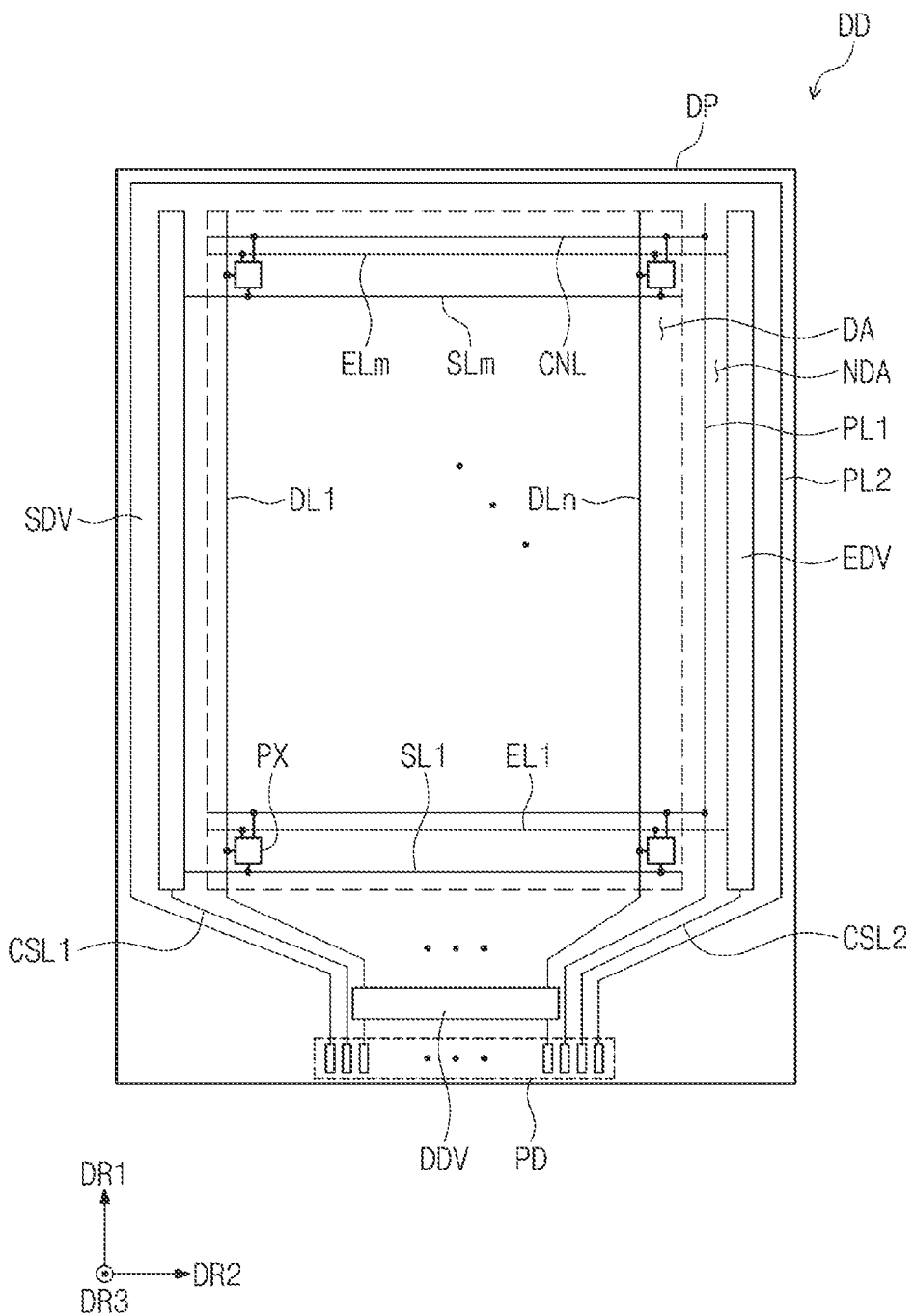
FIG. 5 is a plan view of a display device according to an embodiment of the present disclosure.

FIG. 5 is a plan view of a display device according to an embodiment of the present disclosure.

Referring to FIG. 5, the display device DD may include a display panel DP, a scan driver SDV, a data driver DDV, a light emission driver EDV, and a plurality of pads PD.

The display panel DP may have a rectangular shape having long sides extending in the first direction DR1 and short sides extending in the second direction DR2, but the shape of the display panel DP is not limited thereto. The display panel DP may include a display area DA and a non-display area NDA surrounding the display area DA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, first and second power lines PL1 and PL2, and connection lines CNL (m and n are natural numbers greater than 1).

The pixels PX may be disposed in the display area DA. The scan driver SDV and the light emission driver EDV may be disposed in the non-display area NDA adjacent to the long sides of the display panel DP, respectively. The data driver DDV may be disposed in the non-display area NDA adjacent to one of the short sides of the display panel DP. When viewed on a plane, the data driver DDV may be adjacent to the lower end of the display panel DP.

The scan lines SL1 to SLm may extend in the second direction DR2 and may be connected to the pixels PX and the scan driver SDV. The data lines DL1 to DLn may extend in the first direction DR1 to be connected to the pixels PX and the data driver DDV. The emission lines EL1 to ELm may extend in the second direction DR2 to be connected to the pixels PX and the light emission driver EDV.

The first power line PL1 may extend in the first direction DR1 and may be disposed in the non-display area NDA. The first power line PL1 may be disposed between the display area DA and the light emission driver EDV.

The connection lines CNL extend in the second direction DR2 are arranged in the first direction DR1 to be connected to the first power line PL1 and the pixels PX. The first voltage may be applied to the pixels PX through the first power line PL1 connected to each other and the connection lines CNL. The connection lines CNL may be substantially defined as portions of the first power line PL1 receiving the first voltage.

The second power line PL2 is disposed in the non-display area NDA and may extend along long sides of the display panel DP and the other short side of the display panel DP on which the data driver DDV is not disposed. The second power line PL2 may be disposed outside the scan driver SDV and the light emission driver EDV.

Although not shown, the second power line PL2 may extend toward the display area DA to be connected to the pixels PX. A second voltage having a level lower than the first voltage may be applied to the pixels PX through the second power line PL2.

The first control line CSL1 may be connected to the scan driver SDV and may extend toward the lower end of the display panel DP. The second control line CSL2 may be connected to the light emission driver EDV and may extend toward a lower end of the display panel DP. The data driver DDV may be disposed between the first control line CSL1 and the second control line CSL2.

The pads PD may be disposed in the non-display area NDA adjacent to the lower end of the display panel DP, and may be closer to the lower end of the display panel DP than the data driver DDV. The data driver DDV, the first and second power lines PL1 and PL2, and the first and second control lines CSL1 and CSL2 may be connected to the pads PD. The data lines DL1 to DLn may be connected to the data driver DDV, and the data driver DDV may be connected to the pads PD corresponding to the data lines DL1 to DLn.

Although not shown in the drawing, the display device DD may include a timing controller for controlling operations of the scan driver SDV, the data driver DDV, and the light emission driver EDV, and a voltage generation unit for generating first and second voltages. The timing controller and the voltage generation unit may be connected to the corresponding pads PD through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The light emission driver EDV generates a plurality of emission signals, and the emission signals may be applied to the pixels PX through the emission lines EL1 to ELm.

The pixels PX may be provided with the data voltages in response to the scan signals. The pixels PX may display an image by emitting light having luminance corresponding to data voltages in response to emission signals.

Figure 6:
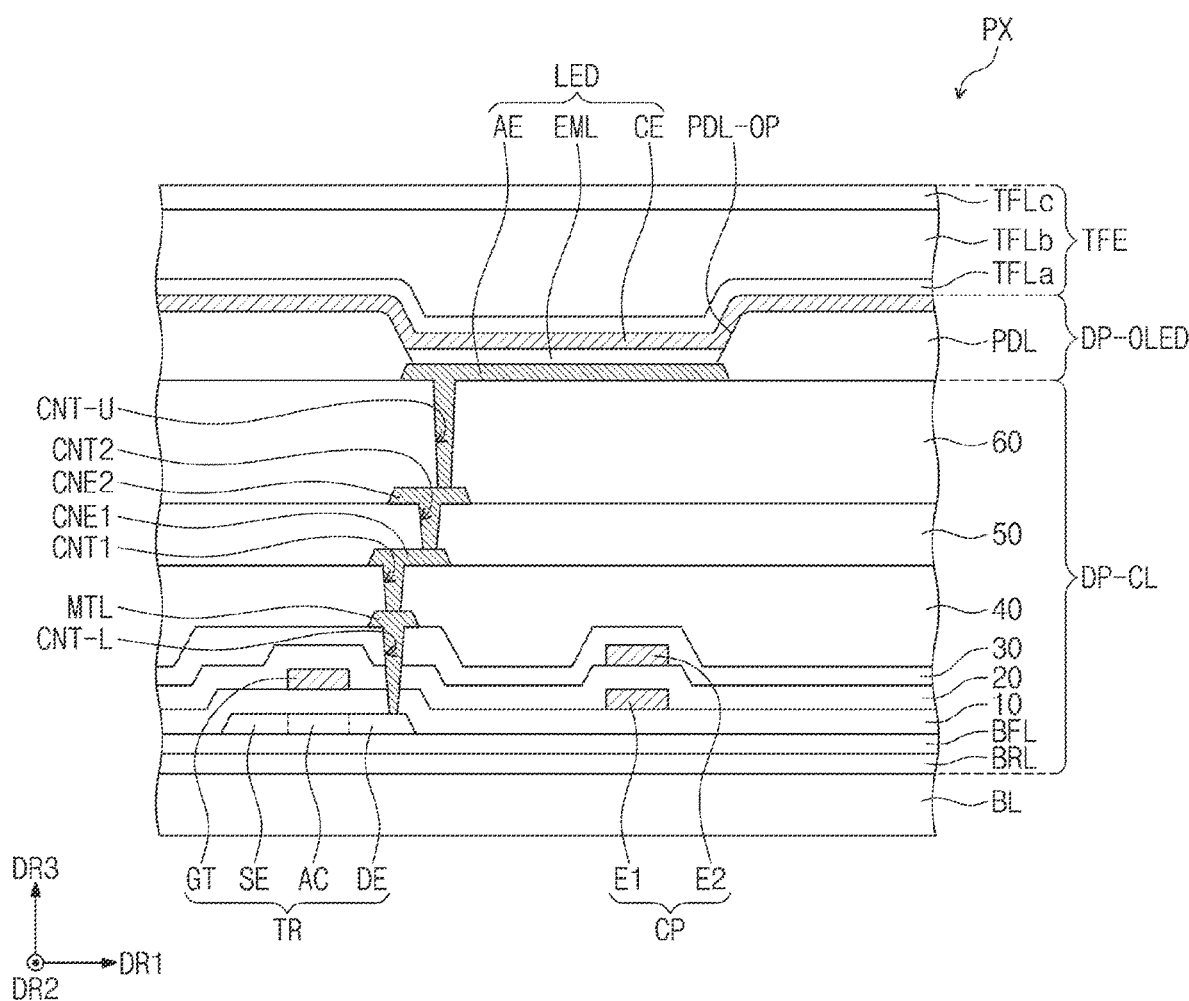
FIG. 6 is a cross-sectional view of one pixel according to an embodiment of the present disclosure.

FIG. 6 is a cross-sectional view of one pixel according to an embodiment of the present disclosure.

Referring to FIG. 6, a pixel PX may include a plurality of insulating layers, a semiconductor pattern, a conductive pattern, a signal line, and the like. An insulating layer, a semiconductor layer, and a conductive layer are formed by coating, vapor deposition, or the like. Thereafter, the insulating layer, the semiconductor layer, and the conductive layer may be selectively patterned by a photolithography method. In this way, a semiconductor pattern, a conductive pattern, a signal line, and the like included in the circuit layer DP-CL and the display element layer DP-OLED are formed. Thereafter, a thin film encapsulation layer TFE covering the display element layer DP-OLED may be formed.

At least, one inorganic insulating layer is formed on the upper surface of the base layer BL. The inorganic insulating layer may include at least one of aluminum oxide, titanium oxide, silicon oxide, silicon nitride, silicon oxynitride, zirconium oxide, and hafnium oxide. The inorganic insulating layer can be formed in multiple layers. The multi-layered inorganic insulating layers may include a barrier layer BRL and/or a buffer layer BFL.

The barrier layer BRL may be disposed on the base layer BL. The barrier layer BRL may include at least one of silicon oxide, silicon nitride, and silicon oxynitride. The buffer layer BFL may be disposed on the barrier layer BRL. The buffer layer BFL may improve bonding force between the base layer BL and the semiconductor pattern. The buffer layer BFL may include at least one of silicon oxide, silicon nitride, and silicon oxynitride. For example, the buffer layer BFL may include a structure in which a silicon oxide layer and a silicon nitride layer are alternately stacked.

The semiconductor pattern may be disposed on the buffer layer BFL. The semiconductor pattern may include polysilicon. However, the embodiment of the present disclosure is not limited thereto, and the semiconductor pattern may include an amorphous silicon or an oxide semiconductor.

FIG. 6 illustrates only some semiconductor patterns, and semiconductor patterns may be further disposed in other areas. The semiconductor pattern can be arranged in a specific rule across the pixels. Semiconductor patterns may have different electrical properties depending on whether they are doped or not. The semiconductor pattern may include a first area having high conductivity and a second area having low conductivity. The first area may be doped with an N-type dopant or a P-type dopant. The P-type transistor may include a doping area doped with a P-type dopant, and the N-type transistor may include a doping area doped with an N-type dopant. The second area may be a non-doped area or an area doped with a lower concentration than the first area.

The conductivity of the first area is greater than that of the second area, and may substantially serve as an electrode or a signal line. The second area may substantially correspond to the active (or channel) of the transistor. In other words, a part of the semiconductor pattern may be an active part of the transistor, another part may be a source or drain of the transistor, and another part may be a connection electrode or a connection signal line.

FIG. 6 illustrates one transistor and a light emitting element included in a pixel.

The source SE, the active AC, and the drain DE of the transistor TR may be formed from a semiconductor pattern. The source SE and the drain DE may be disposed in opposite direction with respect to the active AC.

The first inorganic insulating layer 10 may be disposed on the buffer layer BFL. The first inorganic insulating layer 10 may overlap the plurality of pixels in common and cover the semiconductor pattern. The first inorganic insulating layer 10 may include an inorganic material and may have a single-layer or multi-layer structure. The first inorganic insulating layer 10 may include at least one of aluminum oxide, titanium oxide, silicon oxide, silicon nitride, silicon oxynitride, zirconium oxide, and hafnium oxide. In this embodiment, the first inorganic insulating layer 10 may be a single-layer silicon oxide layer.

The gate GT of the transistor TR is disposed on the first inorganic insulating layer 10. The gate GT may be a part of the metal pattern. The gate GT overlaps the active AC. In the process of doping the semiconductor pattern, the gate GT may function as a mask.

The second inorganic insulating layer 20 is disposed on the first inorganic insulating layer 10 and may cover the gate GT. The second inorganic insulating layer 20 may include an inorganic material and may have a single-layer or multi-layer structure. The second inorganic insulating layer 20 may include at least one of silicon oxide, silicon nitride, and silicon oxynitride. In this embodiment, the second inorganic insulating layer 20 may have a multilayer structure including a silicon oxide layer and a silicon nitride layer.

The capacitor CP may include a first electrode E1 and a second electrode E2 facing the first electrode E1. The first electrode E1 is disposed on the same layer as the gate GT and may include the same material as the gate GT. For example, the first electrode E1 may be disposed between the first inorganic insulating layer 10 and the second inorganic insulating layer 20. The second electrode E2 may be disposed on the second inorganic insulating layer 20. The position of the capacitor CP is not limited to the example illustrated in FIG. 6. For example, the capacitor CP may be disposed over the additional transistor. That is, the capacitor CP may overlap the additional transistor. Through this, an area or space in which a pixel circuit or the like is to be formed may be secured.

The third inorganic insulating layer 30 may be disposed on the second inorganic insulating layer 20, and the third inorganic insulating layer 30 may cover the second electrode E2. The third inorganic insulating layer 30 may have a single-layer or multi-layer structure. For example, the third inorganic insulating layer 30 may have a multilayer structure including a silicon oxide layer and a silicon nitride layer. The lower connection electrode MTL may be disposed on the third inorganic insulating layer 30. The lower connection electrode MTL may be connected to the drain DE of the transistor TR through a lower contact hole CNT-L penetrating the first, second, and third inorganic insulating layers 10, 20, and 30. At least a portion of the lower connection electrode MTL may be disposed inside of the lower contact hole CNT-L and may be connected to the drain DE of the transistor TR.

The circuit layer DP-CL may include at least one of the organic insulating layers 40, 50, and 60.

The first organic insulating layer 40 is disposed on the third inorganic insulating layer 30 and may cover the lower connection electrode MTL. The first organic insulating layer 40 may include an organic material.

The first connection electrode CNE1 may be disposed on the first organic insulating layer 40. The first connection electrode CNE1 may be connected to the lower connection electrode MTL through a first contact hole CNT1 penetrating through the first organic insulating layer 40.

The second organic insulating layer 50 may be disposed on the first organic insulating layer 40 and cover the first connection electrode CNE1. The second organic insulating layer 50 may include an organic material.

The second connection electrode CNE2 may be disposed on the second organic insulating layer 50. The second connection electrode CNE2 may be connected to the first connection electrode CNE1 through a second contact hole CNT2 penetrating through the second organic insulating layer 50.

The third organic insulating layer 60 may be disposed on the second organic insulating layer 50 and cover the second connection electrode CNE2. The third organic insulating layer 60 may include an organic material.

The display element layer DP-OLED including a light emitting element LED may be disposed on the circuit layer DP-CL. The light emitting element LED may include a first electrode AE, a light emitting layer EML, and a second electrode CE.

The first electrode AE may be disposed on the third organic insulating layer 60. The first electrode AE may be connected to the second connection electrode CNE2 through a upper contact hole CNT-U penetrating through the third organic insulating layer 60. That is, the first electrode AE is electrically connected to the drain DE of the transistor TR.

The pixel defining film PDL is disposed on the third organic insulating layer 60 and may cover a portion of the first electrode AE. A pixel opening PDL-OP is defined in the pixel defining film PDL. The pixel opening PDL-OP of the pixel defining film PDL exposes at least a portion of the first electrode AE.

The light emitting layer EML may be disposed on the first electrode AE. The light emitting layer EML may be disposed in an area corresponding to the pixel opening PDL-OP. That is, the light emitting layer EML may be formed separately on each of the pixels. When the light emitting layer EML is separately formed in each of the pixels, each of the light emitting layers EML may emit light of at least one color among blue, red, and green. However, the embodiment of the present disclosure is not limited thereto, and the light emitting layer EML may be connected to the pixels and provided in common. In this case, the light emitting layer EML may provide blue light or white light.

The second electrode CE may be disposed on the light emitting layer EML. The second electrode CE has an integral shape and may be commonly disposed on a plurality of pixels.

Although not shown in the drawing, a hole control layer may be disposed between the first electrode AE and the light emitting layer EML. The hole control layer may include a hole transport layer and may further include a hole injection layer. An electron control layer may be disposed between the light emitting layer EML and the second electrode CE. The electron control layer may include an electron transport layer and may further include an electron injection layer. The hole control layer and the electron control layer may be commonly formed in a plurality of pixels using an open mask.

A thin film encapsulation layer TFE may be disposed on a display element layer DP-OLED. The thin film encapsulation layer TFE may include an inorganic layer TFLa, an organic layer TFLb, and an inorganic layer TFLc sequentially stacked along the third direction DR3, but the layers constituting the thin film encapsulation layer TFE are not limited thereto.

The inorganic layers TFLa and TFLc may protect the display element layer DP-OLED from moisture and oxygen, and the organic layer TFLb may protect the display element layer DP-OLED from foreign substances such as dust particles. The inorganic layers TFLa and TFLc may include a silicon nitride layer, a silicon oxynitride layer, a silicon oxide layer, a titanium oxide layer, or an aluminum oxide layer. The organic layer TFLb may include an acryl-based organic layer, but is not limited thereto.

Figure 7:
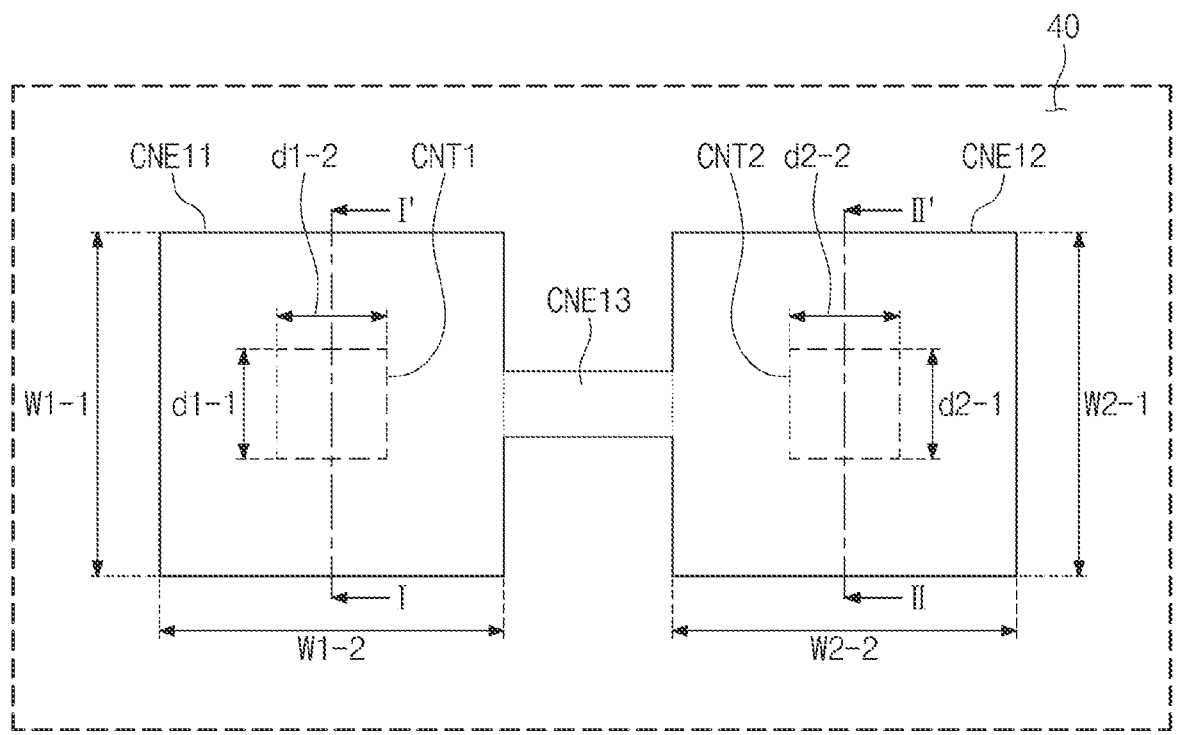
FIG. 7 is a plan view illustrating a partial configuration of a display device according to an embodiment of the present disclosure.
Figure 8A:
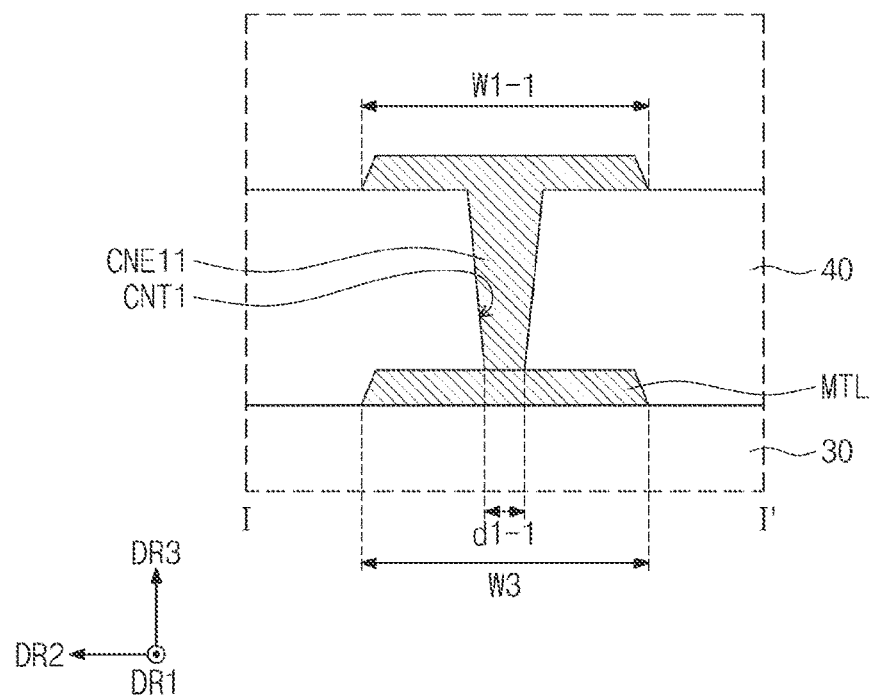
FIGS. 8A and 8B are cross-sectional views of some configurations of a display device according to an embodiment of the present disclosure.
Figure 8B:
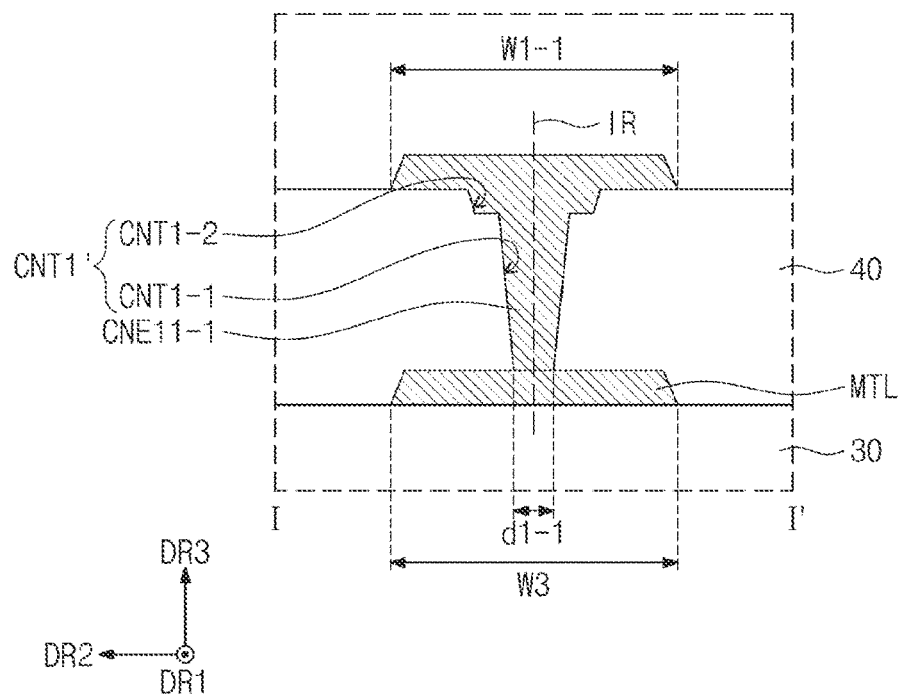
Figure 9:
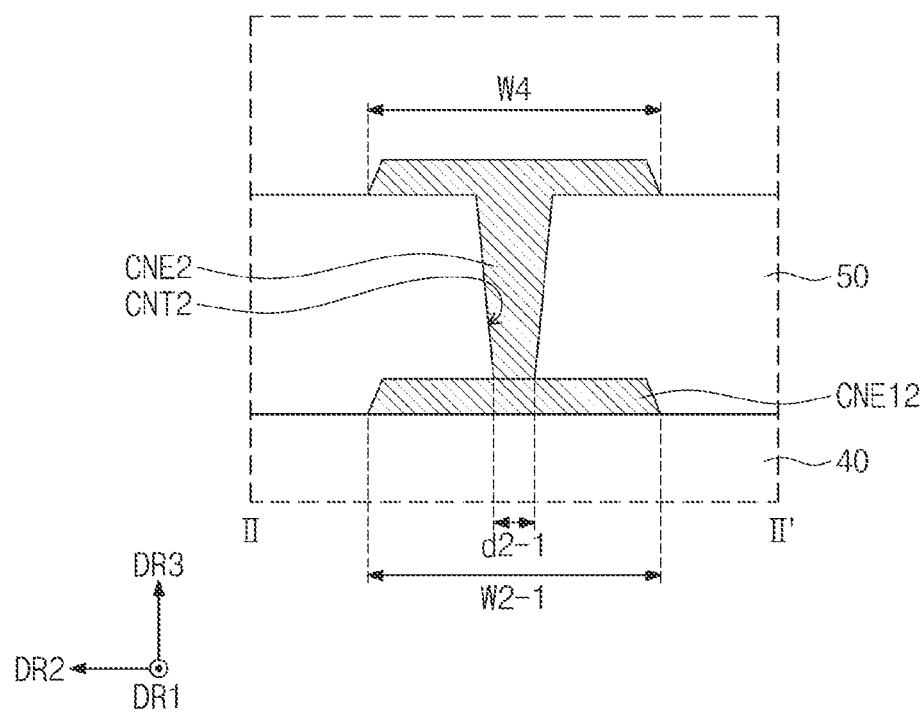
FIG. 9 is a cross-sectional view of a partial configuration of a display device according to an embodiment of the present disclosure.

FIG. 7 is a plan view illustrating a partial configuration of a display device according to an embodiment of the present disclosure. FIGS. 8A and 8B are cross-sectional views of some configurations of a display device according to an embodiment of the present disclosure. FIG. 9 is a cross-sectional view of a partial configuration of a display device according to an embodiment of the present disclosure. FIG. 7 is a plan view of the first connection electrode CNE1 shown in FIG. 6 as viewed from above among components included in the display device according to an embodiment of the present disclosure. FIGS. 8A and 8B are cross-sectional views corresponding to line I-I' of FIG. 7. FIG. 9 shows a cross-section corresponding to line II-II' of FIG. 7.

Referring to FIGS. 6 and 7 together, the first connection electrode CNE1 according to an embodiment is disposed on the first organic insulating layer 40, and may include a first electrode part CNE11 and a second electrode part CNE12. The first electrode part CNE11 may be a part connected to the lower connection electrode MTL through the first contact hole CNT1. The second electrode part CNE12 may be a part connected to the second connection electrode CNE2 through the second contact hole CNT2. The first connection electrode CNE1 may further include a third electrode part CNE13 connecting the first electrode part CNE11 and the second electrode part CNE12. As shown in FIG. 7, the third electrode part CNE13 may have a smaller width in the second direction DR2 than the first electrode part CNE11 and the second electrode part CNE12. However, the embodiment of the present disclosure is not limited thereto, and the third electrode part CNE13 may have substantially the same width as the first electrode part CNE11 and the second electrode part CNE12 in the second direction DR2. Meanwhile, in the present specification, "substantially the same" in thickness, width, and interval may include a case where the design is the same, but there is a slight difference due to an error that may occur in the process in addition to a case where the thickness, width, spacing, and the like are physically exactly the same.

The first electrode part CNE11 may have a first vertical width W1-1 along the second direction DR2 and a first horizontal width W1-2 along the first direction DR1. The first vertical width W1-1 and the first horizontal width W1-2 may correspond to upper widths of a portion of the first electrode part CNE11 disposed on the first organic insulating layer 40. Each of the first vertical width W1-1 and the first horizontal width W1-2 may be about 3.6 micrometers or more and less than about 6 micrometers. The first vertical width W1-1 and the first horizontal width W1-2 may be substantially the same. However, the embodiment of the present disclosure is not limited thereto, and first vertical width W1-1 and the first horizontal width W1-2 may be different from each other.

The second electrode part CNE12 may have a second vertical width W2-1 along the second direction DR2 and a second horizontal width W2-2 along the first direction DR1. The second vertical width W2-1 and the second horizontal width W2-2 may correspond to upper widths of a portion of the second electrode part CNE12 disposed on the first organic insulating layer 40. Each of the second vertical width W2-1 and the second horizontal width W2-2 may be about 3.6 micrometers or more and less than about 6 micrometers. The second vertical width W2-1 and the second horizontal width W2-2 may be substantially the same. However, the embodiment of the present disclosure is not limited thereto, and the second vertical width W2-1 and the second horizontal width W2-2 may be different from each other.

With respect to the first contact hole CNT1 overlapping the first electrode part CNE11 on a plane, the minimum value of the vertical width d1-1 of the first contact hole CNT1 in the second direction DR2 may be greater than or equal to about 1.8 micrometers and less than about 2.5 micrometers. The minimum value of the horizontal width d1-2 of the first contact hole CNT1 in the first direction DR1 may be greater than or equal to about 1.8 micrometers and less than about 2.5 micrometers. The minimum value of the vertical width d1-1 of the first contact hole CNT1 in the second direction DR2 and the minimum value of the horizontal width d1-2 of first contact hole CNT1 in the first direction DR1 may be substantially the same.

With respect to the second contact hole CNT2 overlapping the second electrode part CNE12 on a plane, the minimum value of the vertical width d2-1 of the second contact hole CNT2 in the second direction DR2 may be greater than or equal to about 1.8 micrometers and less than about 2.5 micrometers. The minimum value of the horizontal width d2-2 of the second contact hole CNT2 in the first direction DR1 may be greater than or equal to about 1.8 micrometers and less than about 2.5 micrometers. The minimum value of the vertical width d2-1 of the second contact hole CNT2 in the second direction DR2 and the minimum value of the horizontal width d2-2 of the second contact hole CNT2 in the first direction DR1 may be substantially the same.

Referring to FIGS. 6, 7, and 8A together, in the display device according to an embodiment, the first contact hole CNT1 may have a shape in which the width decreases in the downward direction. Accordingly, the first contact hole CNT1 may have the minimum value of the vertical width d1-1 at a portion exposing a portion of the upper surface of the lower connection electrode MTL. As mentioned above, the minimum value of the vertical width d1-1 of the first contact hole CNT1 may be greater than or equal to about 1.8 micrometers and less than about 2.5 micrometers.

At a portion where the first electrode part CNE11 and the lower connection electrode MTL of the first connection electrode CNE1 are connected through the first contact hole CNT1, the cross-sectional width W3 of the lower connection electrode MTL may be substantially the same as the cross-sectional width W1-1 of the first electrode part CNE11. The cross-sectional width W3 of the lower connection electrode MTL may correspond to an upper width of a portion of the lower connection electrode MTL disposed on the third inorganic insulating layer 30. That is, the width W3 of the lower connection electrode MTL and the width W1-1 of the first electrode part CNE11 may be substantially the same along the second direction DR2. The cross-sectional width W3 of the lower connection electrode MTL may be about 3.6 micrometers or more and less than about 6 micrometers.

Referring to FIGS. 6, 7 and 8B together, in the display device according to an embodiment, the first contact hole CNT1' may include a plurality of contact hole parts CNT1-1 and CNT1-2 having different inclinations. The first contact hole CNT1' may include a first contact hole part CNT1-1 disposed on the lower connection electrode MTL and having a first inclination, and a second contact hole part CNT1-2 defined above the first contact hole part CNT1-1 and having a second inclination. The second inclination of the second contact hole part CNT1-2 may be greater than the first inclination of the first contact hole part CNT1-1 measured from a vertical imaginary axis IR passing the center of the lower connection electrode MTL. The first electrode part CNE11-1 of the first connection electrode CNE1 disposed inside of the first contact hole CNT1' may have a shape corresponding to a shape in which the first contact hole CNT1' is defined.

A width in one direction of the second contact hole part CNT1-2 may be greater than a width in one direction of the first contact hole part CNT1-1. As shown in FIG. 8B, the width of the second contact hole part CNT1-2 in the second direction DR2 may be greater than the width of the first contact hole part CNT1-1 in the second direction DR2. Although not illustrated, the width of the second contact hole part CNT1-2 in the first direction DR1 may be greater than the width of the first contact hole part CNT1-1 in the first direction DR1. The first contact hole CNT1' may have a minimum value of a width in the second direction DR2 at a portion where the first contact hole part CNT1-1 exposes a portion of the upper surface of the lower connection electrode MTL.

Referring to FIGS. 6, 7, and 9 together, the second connection electrode CNE2 may be connected to the second electrode part CNE12 through the second contact hole CNT2. In the display device according to an embodiment, the second contact hole CNT2 may have a shape in which a width decreases in a downward direction. Accordingly, the second contact hole CNT2 may have a minimum value of a horizontal width d2-1 at a portion exposing a portion of the upper surface of the second electrode part CNE12 of the first connection electrode CNE1. As mentioned above, the minimum value of the horizontal width d2-1 of the second contact hole CNT2 may be greater than or equal to about 1.8 micrometers and less than about 2.5 micrometers.

At a portion where the second electrode part CNE12 of the second connection electrode CNE2 and the first connection electrode CNE1 are connected through the second contact hole CNT2, the cross-sectional width W4 of the second connection electrode CNE2 may be substantially the same as the cross-sectional width W2-1 of the second electrode part CNE12. The cross-sectional width W4 of the second connection electrode CNE2 may correspond to an upper width of a portion of the second connection electrode CNE2 disposed on the second organic insulating layer 50. That is, the width W4 of the second connection electrode CNE2 and the width W2-1 of the second electrode part CNE12 may be substantially the same along the second direction DR2. The cross-sectional width W4 of the second connection electrode CNE2 may be about 3.6 micrometers or more and less than about 6 micrometers.

In a display device according to an embodiment of the present disclosure, with respect to the connection electrode connected to the other electrode disposed on the lower or upper part by the contact hole defined in the organic insulating layer, the minimum value of the width of the contact hole in which a part of the connection electrode is disposed is designed to be about 1.8 micrometers or more and less than about 2.5 micrometers, and the upper width of the connection electrode disposed on the organic insulating layer is designed to be about 3.6 micrometers or more and less than about 6 micrometers.

In order to realize high-resolution and high-speed operation of the display device, the number of signal wires increases and the degree of circuit integration increases. In addition, in order to improve the robustness of the display device, when the number of organic insulating layers and connecting electrodes increases, the number of parts to which the connecting electrode is connected through the contact hole also increases, so that it is difficult to configure a pixel layout within a limited pixel pitch. In a display device according to an embodiment of the present disclosure, the width of the contact hole in which a part of the connection electrode is disposed and the width of the upper part of the connection electrode can be designed to be small within the above-mentioned range, so that even if the number of signal wires increases and the number of parts to which the connecting electrode is connected through the contact hole increases, a pixel layout can be configured within a limited pixel pitch. Accordingly, it is possible to realize a display device having high resolution, high speed driving, and high robustness characteristics.

Figure 10:
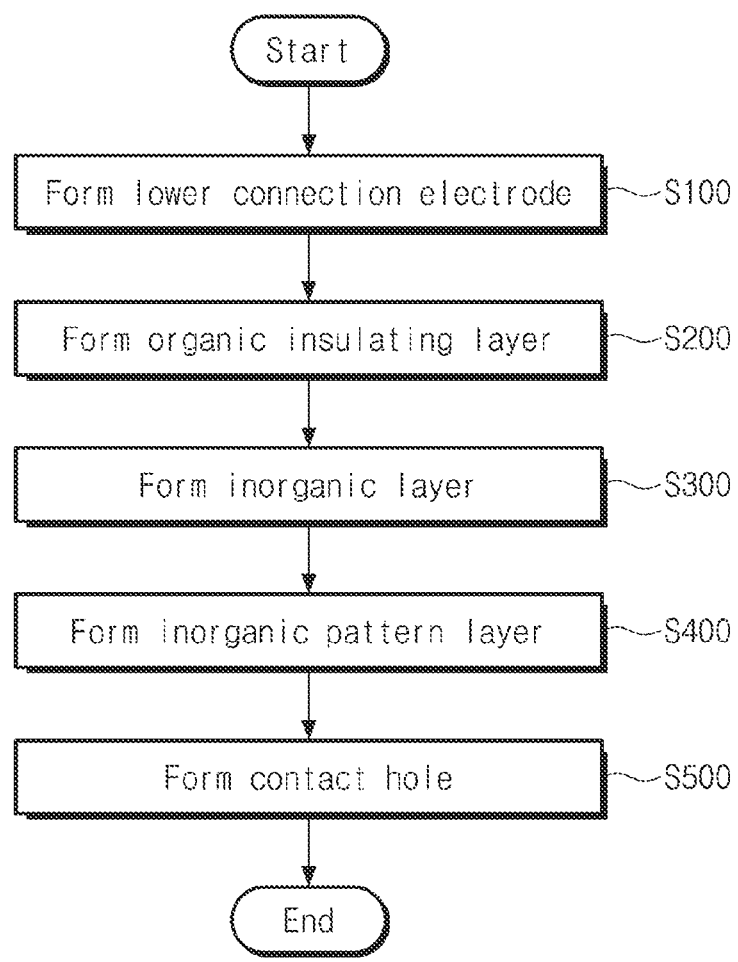
FIG. 10 is a flowchart illustrating a method of manufacturing a display device according to an embodiment of the present disclosure.

FIG. 10 is a flowchart illustrating a method of manufacturing a display device according to an embodiment of the present disclosure. FIGS. 11A, 11B, 11C, 11D, 11E, 11F, and 11G are cross-sectional views sequentially illustrating some operations of a method of manufacturing a display device according to an embodiment. FIGS. 12A, 12B, 12C, 12D, and 12E are cross-sectional views sequentially illustrating some operations of a method of manufacturing a display device according to another embodiment of the present disclosure. In FIGS. 11A, 11B, 11C, 11D, 11E, 11F, and 11G, at the section corresponding to FIG. 8A, the operations of forming a structure in which the lower connection electrode MTL and the first electrode part CNE11 of the first connection electrode CNE1 are connected through the first contact hole CNT1 are sequentially illustrated. In FIGS. 12A, 12B, 12C, 12D, and 12E, at the section corresponding to FIG. 8B, the operations of forming a structure in which the lower connection electrode MTL and the first electrode part CNE11 of the first connection electrode CNE1 are connected through the first contact hole CNT1 are sequentially illustrated. Meanwhile, in describing a method of manufacturing a display device according to an embodiment of the present disclosure with reference to FIGS. 10, 11A, 11B, 11C, 11D, 11E, 11F, and 11G, and 12A, 12B, 12C, 12D, and 12E, the same reference numerals are given to the same components as those described above, and detailed descriptions thereof will be omitted. Meanwhile, in FIGS. 11A, 11B, 11C, 11D, 11E, 11F, and 11G and 12A, 12B, 12C, 12D, and 12E, although the operation of forming a structure in which the first electrode part of the first connection electrode is connected to the lower connection electrode through the first contact hole is exemplarily illustrated, the embodiment of the present disclosure is not limited thereto, and the operation of forming a structure in which the second connection electrode is connected to the second electrode part of the first connection electrode through the second contact hole may also be performed by the manufacturing method according to an embodiment of the present disclosure.

Referring to FIG. 10, a method of manufacturing a display device according to an embodiment of the present disclosure includes steps of forming a lower connecting electrode (S100), forming an organic insulating layer covering the lower connecting electrode (S200), and forming a contact hole exposing some of the lower connection electrodes in the organic insulating layer. The step of forming of the contact hole includes steps of forming an inorganic layer on the organic insulating layer (S300), etching the inorganic layer to form an inorganic pattern layer in which an opening is defined (S400), and etching the organic insulating layer using the inorganic pattern layer as a mask (S500).

Figure 11A:
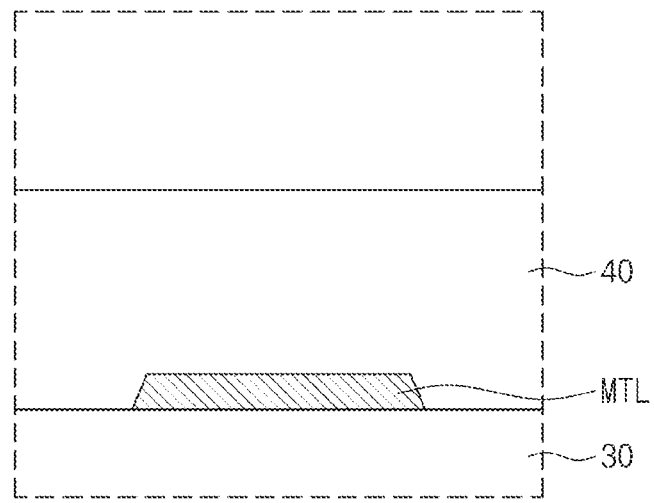
FIGS. 11A, 11B, 11C, 11D, 11E, 11F, and 11G are cross-sectional views sequentially illustrating some steps of a method of manufacturing a display device according to an embodiment.
Figure 11B:
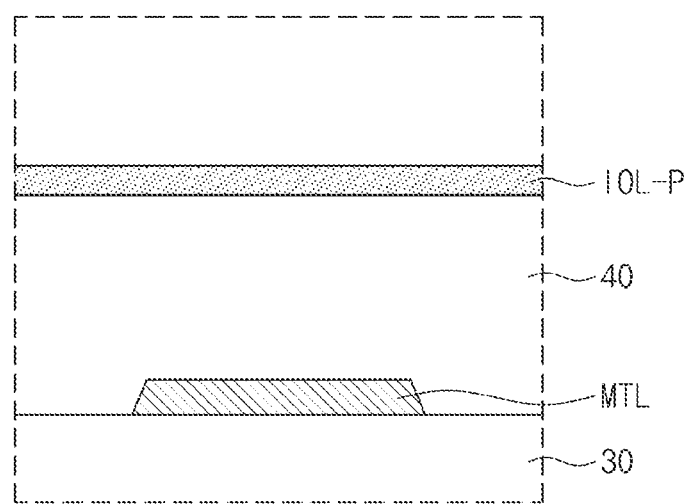
Figure 11C:
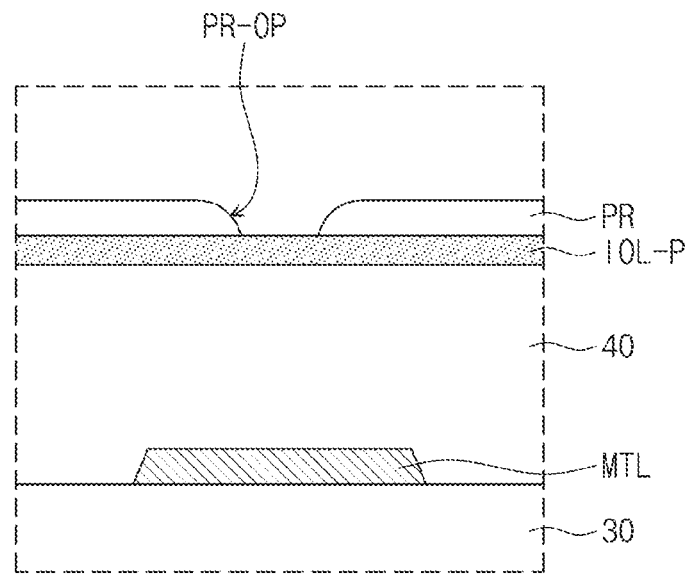

Referring to FIGS. 10, 11A, and 11B, in the method of manufacturing a display device according to an embodiment, after the lower connection electrode MTL is formed on the third inorganic insulating layer 30, a first organic insulating layer 40 covering the lower connection electrode MTL is formed. The first organic insulating layer 40 may include an organic insulating material and have a flat upper surface. An inorganic layer IOL-P is formed on the first organic insulating layer 40.

The inorganic layer IOL-P may be a preliminary layer for manufacturing a hard mask for forming a contact hole to be described later. The inorganic layer IOL-P may include, for example, a transparent conductive oxide such as indium tin oxide (ITO) or indium zinc oxide (IZO). Alternatively, the inorganic layer IOL-P may include a silicon-based inorganic material such as silicon oxide, silicon nitride, or silicon oxynitride. The inorganic layer IOL-P may be formed through a deposition process.

Referring to FIGS. 10 and 11B, 11C, and 11D, in the method of manufacturing a display device according to an embodiment, the inorganic layer IOL-P is patterned to form the inorganic pattern layer IOL-M. The inorganic pattern layer IOL-M may be formed by defining an opening IOL-OP in the inorganic layer IOL-P.

The forming of the inorganic pattern layer IOL-M may include forming a photoresist pattern PR on the inorganic layer IOL-P, and forming an opening IOL-OP by etching the inorganic layer IOL-P using the photoresist pattern PR as a mask. The photoresist pattern PR may include a positive photoresist or a negative photoresist. A photoresist opening PR-OP for forming the opening IOL-OP of the inorganic layer IOL-P may be formed in the photoresist pattern PR.

The etching of the inorganic layer IOL-P using the photoresist pattern PR as a mask may be performed through a wet etching process or a dry etching process. Through a wet etching or dry etching process, the opening IOL-OP may be formed to form an inorganic pattern layer IOL-M. A portion of the opening IOL-OP of the inorganic pattern layer IOL-M may have a greater width than the photoresist opening PR-OP. The uppermost width of the opening IOL-OP of the inorganic pattern layer IOL-M may be greater than the lowermost width of the photoresist opening PR-OP.

Referring to FIGS. 10 and 11D, 11E, and 11F, in the method of manufacturing a display device according to an embodiment, by using the inorganic pattern layer IOL-M as a mask, the first organic insulating layer 40 is etched to form a first contact hole CNT1. The inorganic pattern layer IOL-M on which the opening IOL-OP is formed may function as a hard mask in the etching process of the first organic insulating layer 40. In the operation of etching the first organic insulating layer 40 using the inorganic pattern layer IOL-M as a mask, the first organic insulating layer 40 may be dry-etched. After the operation of etching the first organic insulating layer 40, the inorganic pattern layer IOL-M functioning as a mask may be removed through a wet etching process or a dry etching process.

Figure 11D:
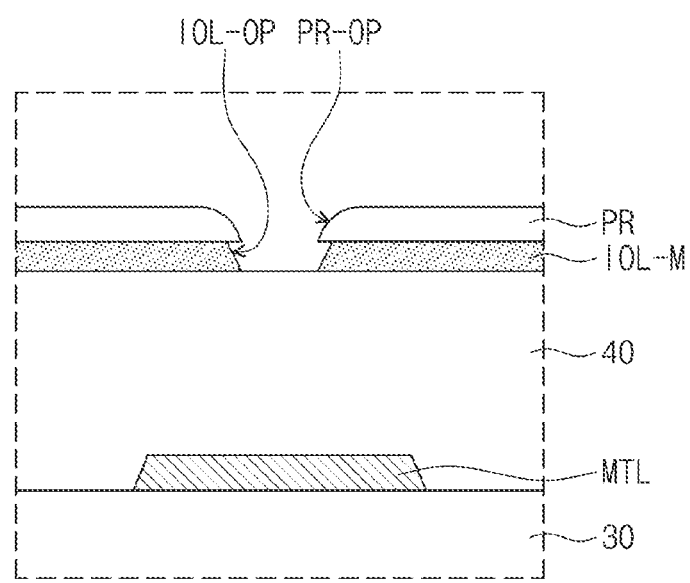
Figure 11E:
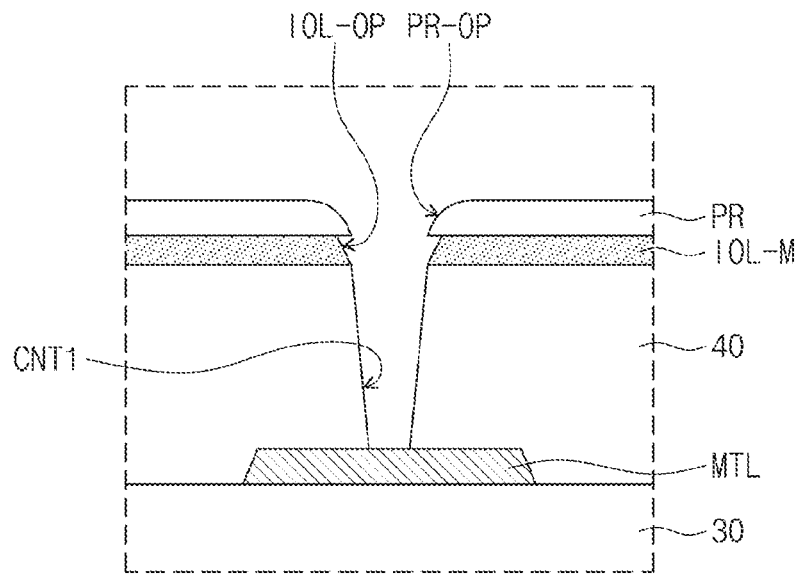

The photoresist pattern PR may be removed after forming the first contact hole CNT1 by etching the first organic insulating layer 40. However, the embodiment of the present disclosure is not limited thereto, and the photoresist pattern PR may be removed before forming the first contact hole CNT1 by etching the first organic insulating layer 40. In an embodiment, the photoresist pattern PR may be removed before forming the first contact hole CNT1 after the inorganic pattern layer IOL-M is formed as shown in FIG. 11D. That is, after the photoresist pattern PR is removed, a process of etching the first organic insulating layer 40 using the inorganic pattern layer IOL-M as a mask may be performed.

Figure 11F:
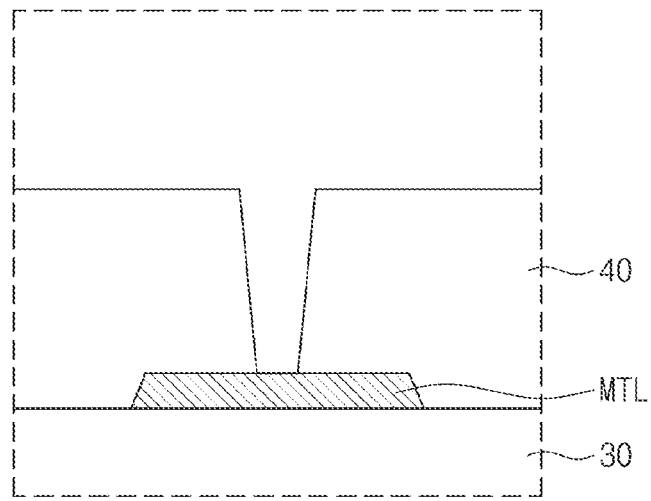
Figure 11G:
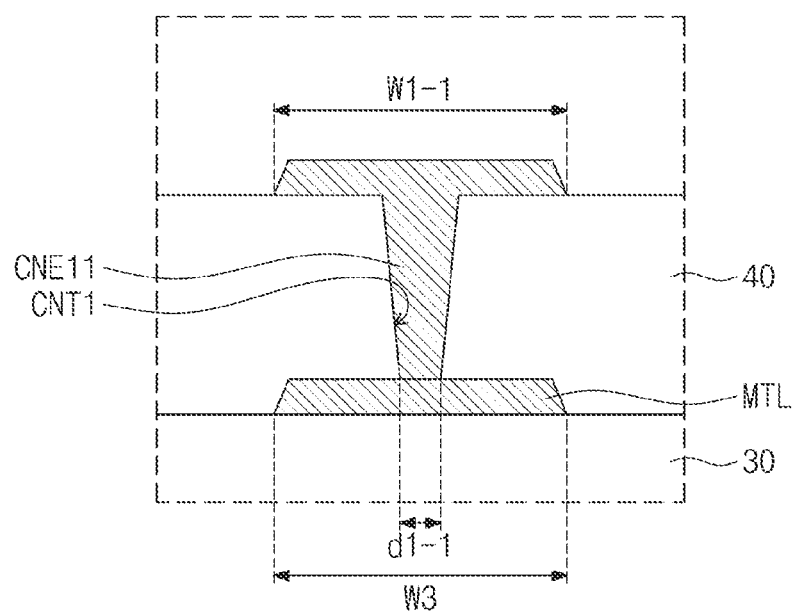

Referring to FIGS. 10, 11F, and 11G, after forming the first contact hole CNT1, a first electrode part CNE11, which is a part of the first connection electrode, is formed on the first organic insulating layer 40, so that a portion of the first electrode part CNE11 is connected to the lower connection electrode MTL through the first contact hole CNT1. The minimum value of the vertical width d1-1 (i.e., FIG. 7) in one direction of the first contact hole CNT1 formed through the etching process of the first organic insulating layer 40 may be about 1.8 micrometers or more and less than 2.5 micrometers. The first contact hole CNT1 may have a shape in which a width decreases in a downward direction, and accordingly, the first contact hole CNT1 may have a minimum value of the vertical width d1-1 at a portion exposing a portion of the upper surface of the lower connection electrode MTL. Accordingly, the width of a portion of the upper surface of the lower connection electrode MTL exposed by the first contact hole CNT1 may be about 1.8 micrometers or more and less than 2.5 micrometers.

In the method of manufacturing a display device according to an embodiment, a dry etching process is performed using the inorganic pattern layer as a hard mask to etch the organic insulating layer to form a contact hole. Accordingly, it may be possible to form a contact hole having a small width for realizing high resolution, high speed driving, and high robustness characteristics.

Anisotropic etching should be performed to form a small-width contact hole in the organic insulating layer, but when the organic insulating layer is etched through a normal photolithography process, the molecular weight of the organic insulating layer is larger than that of photoresist, so that the isotropic etching is performed instead of the anisotropic etching, and accordingly, the width of the contact hole is increased. In addition, if the process of etching the thick organic insulating layer takes time, during the process, the opening width of the photoresist can be expanded than at the beginning of the process, the width of the contact hole may be further increased. In the method of manufacturing a display device according to an embodiment of the present disclosure, as the dry etching process is performed using the inorganic pattern layer as a hard mask, etching the organic insulating layer, anisotropic etching may proceed, and defects such as enlargement of the opening of the inorganic pattern layer including the inorganic material during the process are prevented, so that it may be possible to form a contact hole with a small width for realizing high resolution, high speed driving, and high robustness characteristics.

Figure 12A:
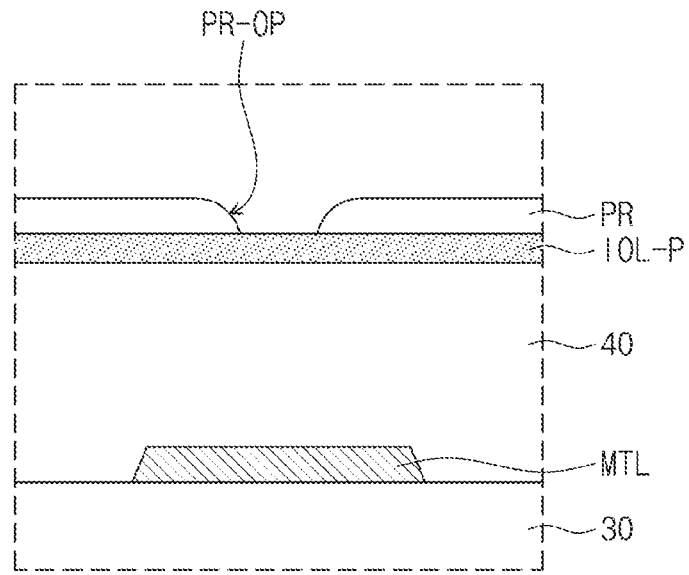
FIGS. 12A, 12B, 12C, 12D, and 12E are cross-sectional views sequentially illustrating some steps of a method of manufacturing a display device according to an embodiment.
Figure 12B:
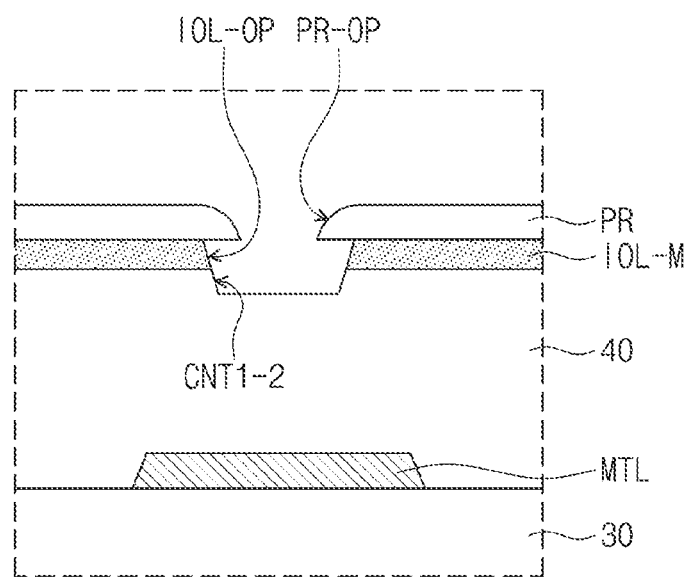
Figure 12C:
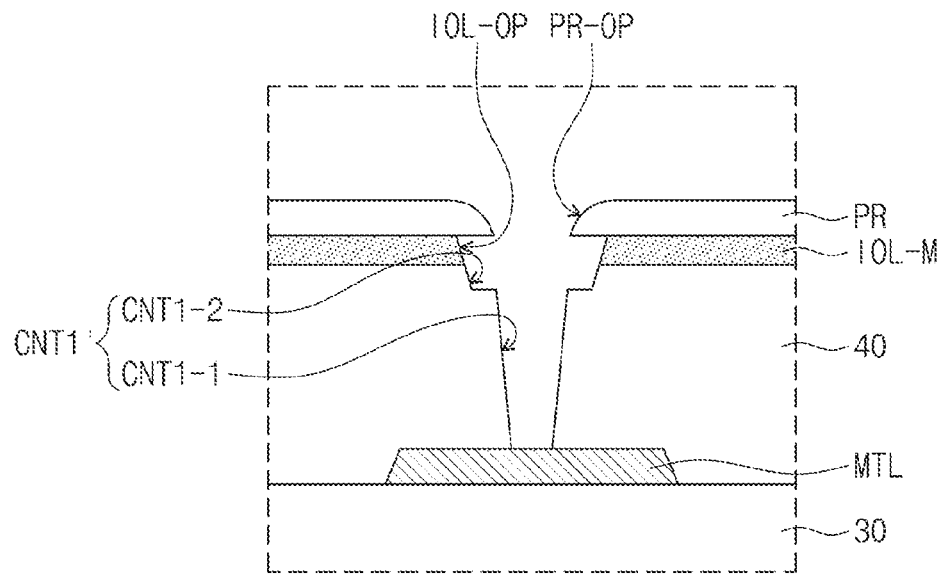
Figure 12D:
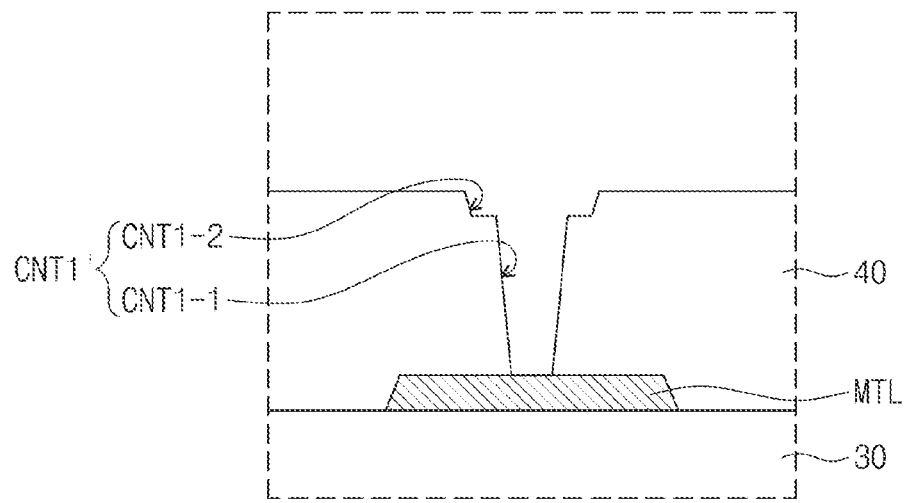
Figure 12E:
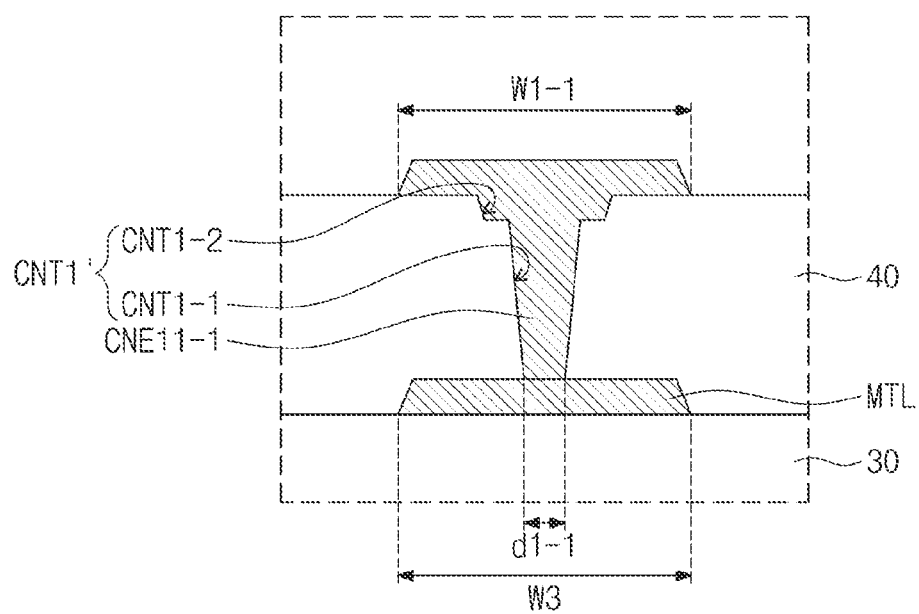

Referring to FIGS. 10, 12A and 12B together, in the operation of patterning the inorganic layer IOL-P to form the inorganic pattern layer IOL-M, an upper portion of the first organic insulating layer 40 may be etched together. More specifically, when wet etching or dry etching is performed using the photoresist pattern PR as a mask to form the opening IOL-OP of the inorganic pattern layer IOL-M, an upper portion of the first organic insulating layer 40 may be etched together. An upper portion of the first organic insulating layer 40 may be etched to form a second contact hole part CNT1-2.

Referring to FIGS. 10, 12B, 12C, 12D, and 12E together, in the operation of etching the first organic insulating layer 40, the remaining part except for the upper part of the first organic insulating layer 40 etched in the previous operation may be etched to form the first contact hole part CNT1-1. The first contact hole part CNT1-1 may be formed through a dry etching process using the photoresist pattern PR as a mask. In the operation of etching the first organic insulating layer 40, as a difference occurs between the width of the photoresist opening PR-OP of the photoresist pattern PR and the width of the second contact hole part CNT1-2, when performing dry etching process, anisotropic etching may proceed when etching the organic insulating layer, so that a contact hole having a small width may be formed. The first contact hole part CNT1-1 may have a smaller width than the second contact hole part CNT1-2.

After the first contact hole CNT1' including the first contact hole part CNT1-1 and the second contact hole part CNT1-2 is formed, the photoresist pattern PR and the inorganic pattern layer IOL-M may be removed. Thereafter, a first electrode part CNE11-1, which is a part of the first connection electrode, is formed on the first organic insulating layer 40, so that a portion of the first electrode part CNE11-1 is connected to the lower connection electrode MTL through the first contact hole CNT1'. The minimum value of the vertical width d1-1 (i.e., FIG. 7) in one direction of the first contact hole part CNT1-1 of the first contact hole CNT1' formed through the etching process of the first organic insulating layer 40 may be greater than or equal to about 1.8 micrometers and less than 2.5 micrometers. The first contact hole part CNT1-1 may have a shape in which a width decreases in a downward direction, and accordingly, the first contact hole part CNT1-1 may have a minimum value of the vertical width d1-1 at a portion exposing a portion of the upper surface of the lower connection electrode MTL. Accordingly, the width of a portion of the upper surface of the lower connection electrode MTL exposed by the first contact hole part CNT1-1 may be about 1.8 micrometers or more and less than 2.5 micrometers.

According to an embodiment of the present disclosure, even if the number of signal wires increases and the degree of circuit integration increases, it becomes possible to construct a pixel layout within a limited pixel pitch, so that a display device having high resolution, high speed driving, and high robustness characteristics may be realized.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

What is claimed is:

1. A display device comprising:
   a base layer;
   a circuit layer disposed on the base layer; and
   a light emitting element disposed on the circuit layer,
   wherein the circuit layer includes at least one organic insulating layer in which a contact hole is defined; and
   a connection electrode disposed on the at least one organic insulating layer, a portion of which is disposed in the contact hole,
   wherein a minimum value of a width in one direction of the contact hole is about 1.8 micrometers or more and less than about 2.5 micrometers,
   wherein an upper width of the connection electrode in the one direction is about 3.6 micrometers or more and less than about 6 micrometers,
   wherein the circuit layer includes:
   a transistor disposed between the at least one organic insulating layer and the base layer; and
   a lower connection electrode connected to the transistor and electrically connected to the connection electrode and,
   wherein an upper width of the lower connection electrode in the one direction is substantially equal to an upper width of the connection electrode in the one direction.

2. The display device of claim 1, wherein the at least one organic insulating layer includes:
   a first organic insulating layer disposed on the transistor; and
   a second organic insulating layer disposed on the first organic insulating layer,
   wherein a first contact hole is defined in the first organic insulating layer, and
   wherein a minimum value of a width of the first contact hole in the one direction is about 1.8 micrometers or more and less than about 2.5 micrometers.

3. The display device of claim 2, wherein the connection electrode includes a first connection electrode disposed in the first contact hole, and
   wherein an upper width of the first connection electrode in the one direction is about 3.6 micrometers or more and less than about 6 micrometers.

4. The display device of claim 3, wherein a second contact hole is defined in the second organic insulating layer,
   wherein the connection electrode further includes a second connection electrode disposed in the second contact hole and electrically connected to the first connection electrode,
   wherein a minimum value of a width of the second contact hole in the one direction is about 1.8 micrometers or more and less than about 2.5 micrometers, and
   wherein an upper width of the second connection electrode in the one direction is about 3.6 micrometers or more and less than about 6 micrometers.

5. The display device of claim 1, wherein the circuit layer includes at least one inorganic insulating layer disposed between the base layer and the organic insulating layer,
   wherein a lower contact hole is defined in the at least one inorganic insulating layer, and
   wherein the lower connection electrode is connected to the transistor through the lower contact hole.

6. The display device of claim 1, wherein the contact hole includes:
   a first contact hole part having a first inclination measured from a vertical imaginary axis; and
   a second contact hole part defined on the first contact hole part and having a second inclination measured from the same vertical imaginary axis greater than the first inclination.

7. The display device of claim 6, wherein a minimum value of a width in the one direction of the first contact hole part is about 1.8 micrometers or more and less than about 2.5 micrometers.

8. The display device of claim 1, wherein the light emitting element includes:
- a first electrode disposed on the organic insulating layer;
- a light emitting layer disposed on the first electrode; and
- a second electrode disposed on the light emitting layer,
- wherein an upper contact hole exposing an upper surface of the connection electrode is defined in the organic insulating layer, and
- wherein a portion of the first electrode is disposed in the upper contact hole and connected to the connection electrode.

9. A display device comprising:
- a base layer;
- a circuit layer disposed on the base layer; and
- a light emitting element disposed on the circuit layer;

wherein the circuit layer includes:
- at least one organic insulating layer in which a contact hole is defined; and
- a connection electrode, a portion of the connection electrode being disposed in the contact hole, wherein the contact hole includes:
- a first contact hole part having a first inclination measured from a vertical imaginary axis; and
- a second contact hole part defined on the first contact hole part and having a second inclination measured from the same vertical imaginary axis, wherein the second inclination of the second contact hole part is greater than the first inclination of the first contact hole part with respect to the vertical imaginary axis, and wherein a minimum value of a width in one direction of the first contact hole part is about 1.8 micrometers or more and less than about 2.5 micrometers.

* * * * *